(12) United States Patent
    Baraskar et al.

(10) Patent No.: US 9,673,216 B1
(45) Date of Patent: Jun. 6, 2017

(54) METHOD OF FORMING MEMORY CELL FILM

(71) Applicant: SanDisk Technologies LLC, Plano, TX (US)

(72) Inventors: Ashish Baraskar, Santa Clara, CA (US); Liang Pang, Fremont, CA (US); Yingda Dong, San Jose, CA (US); Ching-huang Lu, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/212,682

(22) Filed: Jul. 18, 2016

(51) Int. Cl.
| | |
|---|---|
| *H01L 27/115* | (2017.01) |
| *H01L 21/311* | (2006.01) |
| *H01L 27/11582* | (2017.01) |
| *H01L 21/02* | (2006.01) |
| *H01L 21/28* | (2006.01) |
| *H01L 27/11556* | (2017.01) |

(52) U.S. Cl.
CPC .... *H01L 27/11582* (2013.01); *H01L 21/0217* (2013.01); *H01L 21/02063* (2013.01); *H01L 21/02164* (2013.01); *H01L 21/02532* (2013.01); *H01L 21/02636* (2013.01); *H01L 21/28273* (2013.01); *H01L 21/28282* (2013.01); *H01L 21/31111* (2013.01); *H01L 27/11556* (2013.01)

(58) Field of Classification Search
None
See application file for complete search history.

(56) References Cited

U.S. PATENT DOCUMENTS

| | | | |
|---|---|---|---|
| 6,689,653 B1 | 2/2004 | Seah et al. | |
| 8,501,629 B2 | 8/2013 | Tang et al. | |
| 8,614,126 B1 | 12/2013 | Lee et al. | |
| 8,946,023 B2 | 2/2015 | Makala et al. | |
| 9,136,282 B2 | 9/2015 | Qin et al. | |
| 9,252,151 B2 | 2/2016 | Chien et al. | |
| 2013/0341702 A1 | 12/2013 | Kar et al. | |
| 2015/0262826 A1* | 9/2015 | Yun | H01L 27/11578 438/269 |
| 2016/0118392 A1* | 4/2016 | Tang | H01L 27/11524 257/315 |
| 2016/0133638 A1* | 5/2016 | Simsek-Ege | H01L 27/11524 257/314 |
| 2016/0133752 A1* | 5/2016 | Hopkins | H01L 29/42324 257/316 |

(Continued)

*Primary Examiner* — Asok K Sarkar
(74) *Attorney, Agent, or Firm* — Vierra Magen Marcus LLP

(57) ABSTRACT

Disclosed herein are methods of forming memory cell films in 3D memory. An opening having a sidewall may be formed through a stack of alternating layers of silicon oxide and silicon nitride. Bird's beaks may be formed in the silicon nitride at interfaces with the silicon oxide. In one aspect, bird's beaks are formed using a wet SiN etch. In one aspect, bird's beaks are formed by oxidizing SiN. A dilute hydrofluoric acid (DHF) clean may be performed within the opening after forming the bird's beaks in the silicon nitride. A memory cell film may be formed in the opening after performing the DHF clean. The memory cell film is straight, or nearly straight, from top to bottom in a memory hole. The memory cell film is not as susceptible to parasitic charge trapping as a memory cell film having a wavy contour. Therefore, neighbor WL interference may be reduced.

20 Claims, 30 Drawing Sheets

(56) References Cited

U.S. PATENT DOCUMENTS

| | | | |
|---|---|---|---|
| 2016/0148949 A1* | 5/2016 | Jayanti | H01L 21/28282 |
| | | | 257/66 |
| 2016/0181272 A1* | 6/2016 | Rabkin | H01L 21/02653 |
| | | | 438/268 |
| 2017/0011995 A1* | 1/2017 | Chung | H01L 27/11565 |
| 2017/0018565 A1* | 1/2017 | Nishida | H01L 27/11582 |
| 2017/0018568 A1* | 1/2017 | Fujita | H01L 27/11582 |
| 2017/0033044 A1* | 2/2017 | Choi | H01L 23/485 |
| 2017/0062458 A1* | 3/2017 | Sasaki | H01L 27/11582 |
| 2017/0069636 A1* | 3/2017 | Park | H01L 27/1157 |
| 2017/0069652 A1* | 3/2017 | Arai | H01L 27/11582 |
| 2017/0084696 A1* | 3/2017 | Lee | H01L 29/1037 |

* cited by examiner

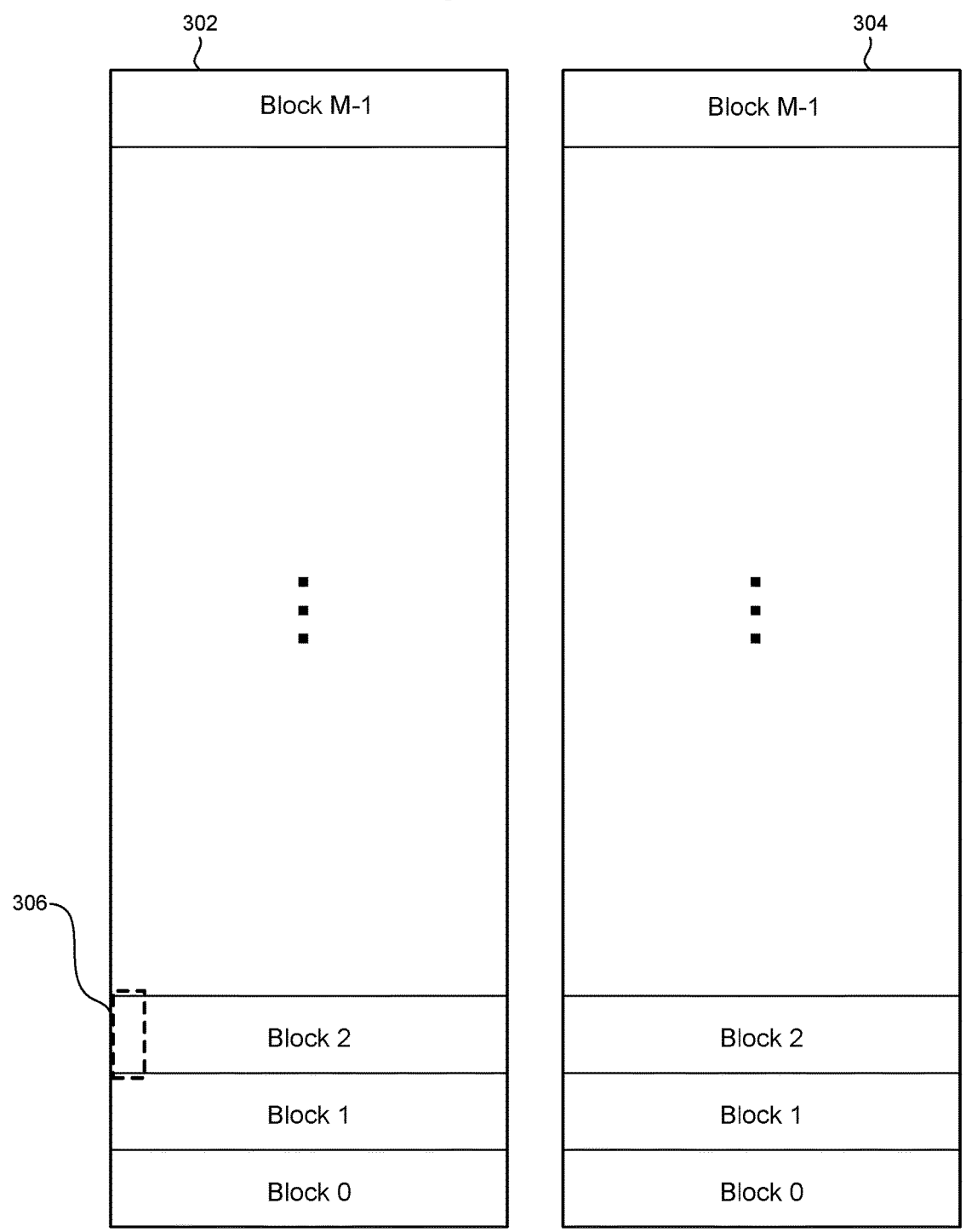

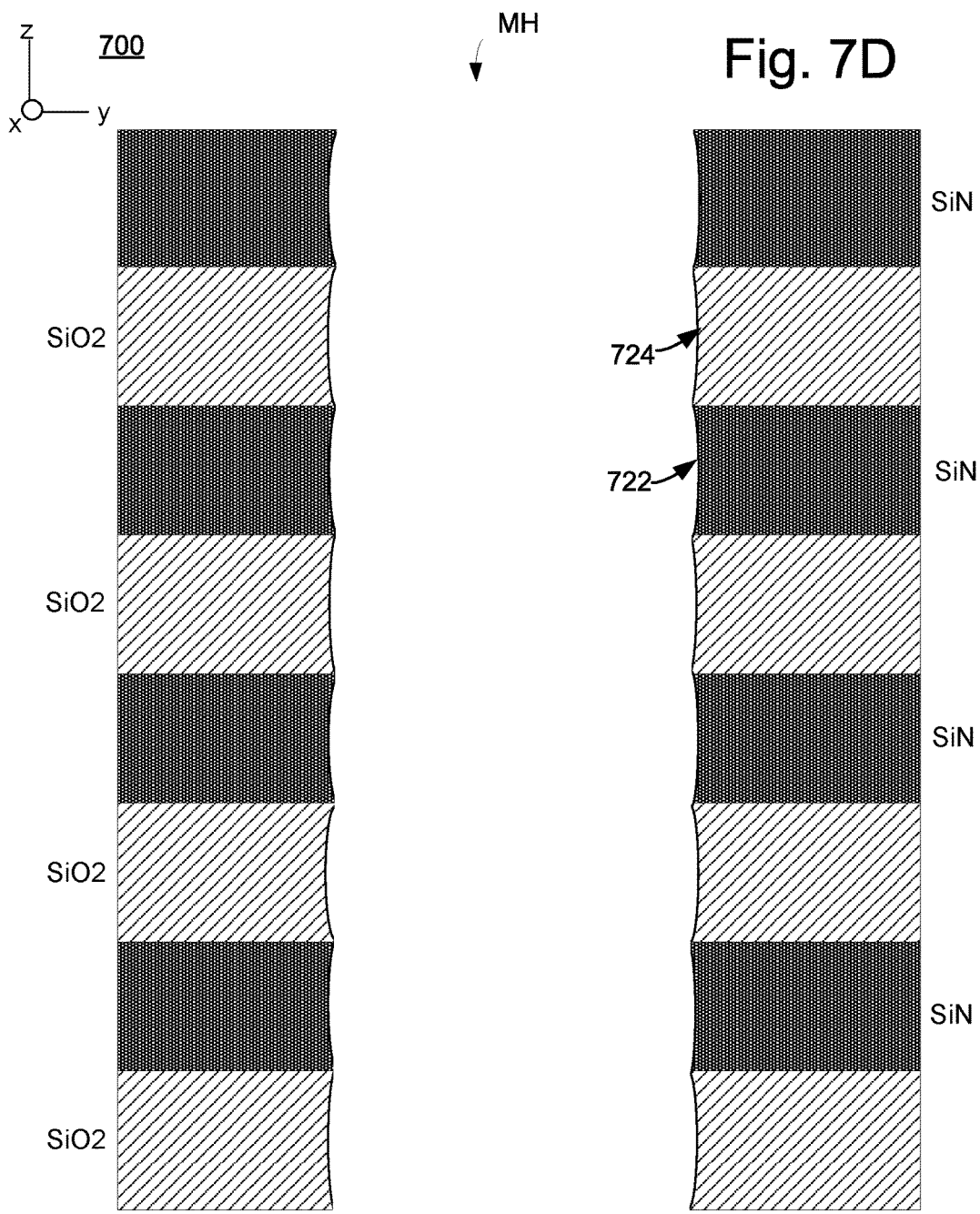

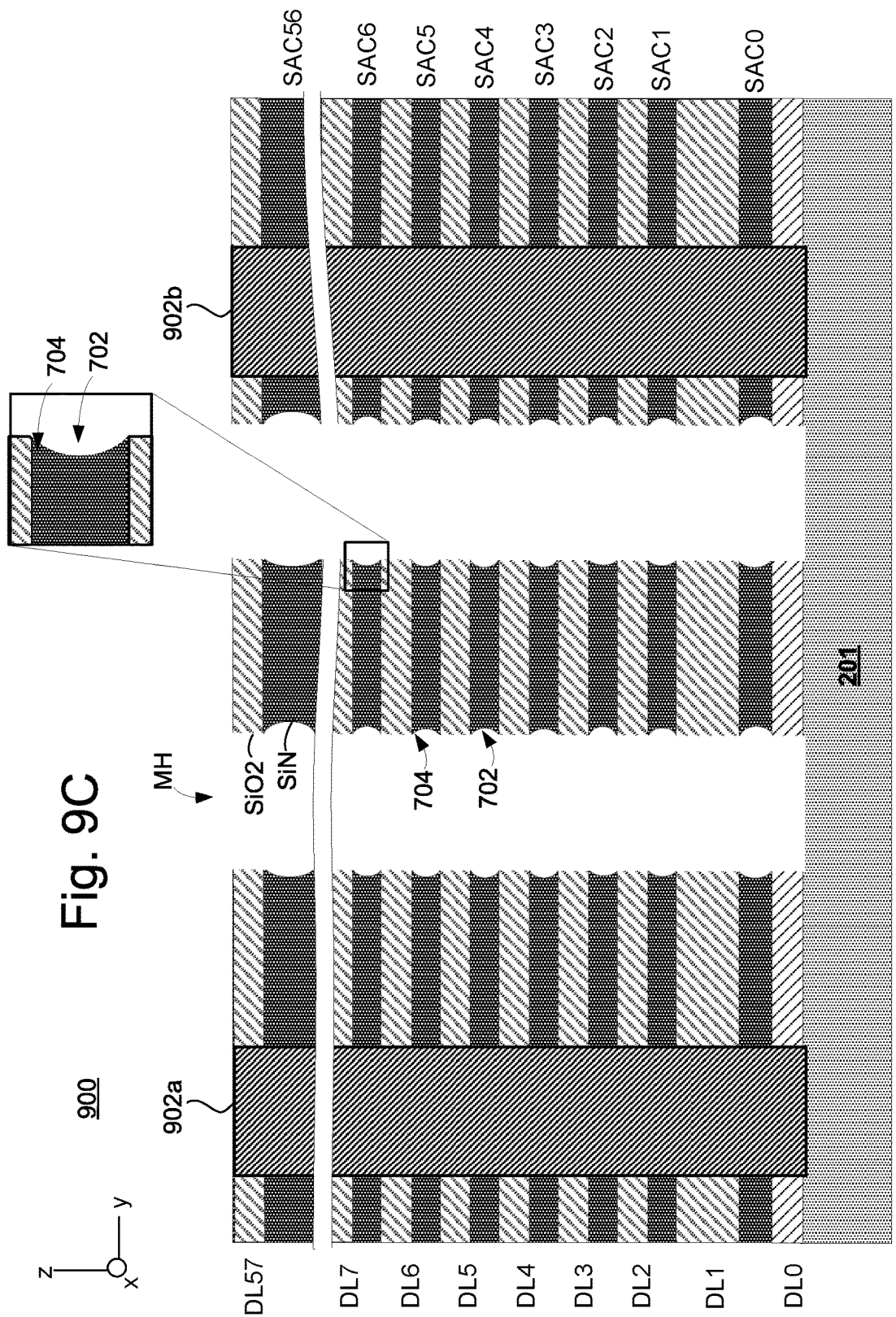

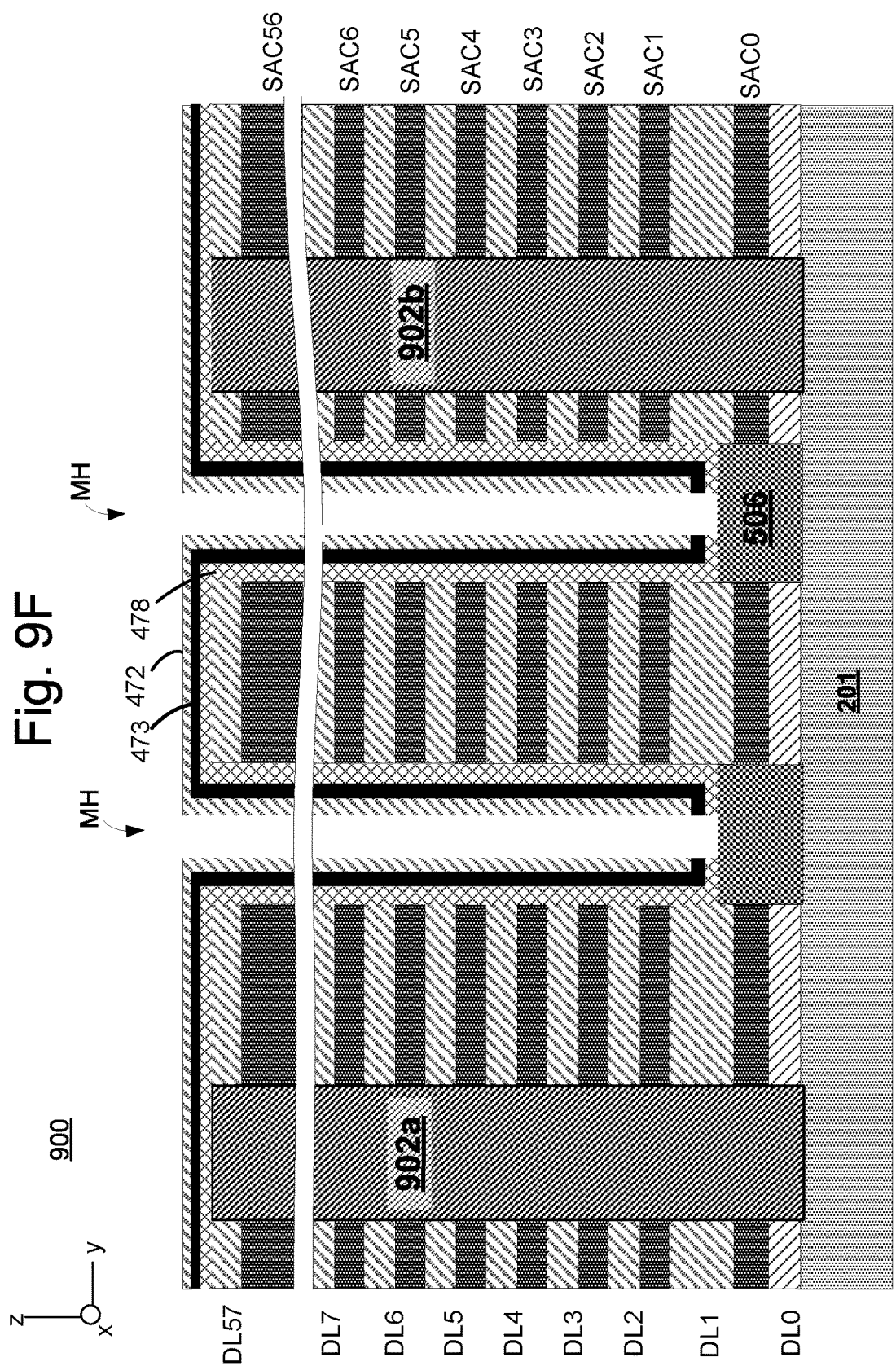

METHOD OF FORMING MEMORY CELL FILM

BACKGROUND

The present technology relates to non-volatile memory.

Recently, ultra high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. In one technique, a memory hole is drilled in the layers to define many memory layers simultaneously. A NAND string is then formed by filling the memory hole with appropriate materials. Control gates of the memory cells are provided by the conductor layers. Select gates are formed at either end of the memory hole.

BRIEF DESCRIPTION OF THE DRAWINGS

Like-numbered elements refer to common components in the different figures.

FIG. 4A is a block diagram explaining one example organization of memory structure.

FIGS. 7A-7E depict details of during embodiments of process 600.

FIGS. 9A-9I depict results after various steps of process 800 of FIG. 8.

DETAILED DESCRIPTION

Disclosed herein are methods of forming memory cell films in 3D memory. In some embodiments, forming memory cell film includes forming alternating layers of silicon oxide and silicon nitride. Then, memory holes having vertical sidewalls are formed in the alternating layers of silicon oxide and silicon nitride. In one embodiment, bird's beaks are formed in the silicon nitride at interfaces with the silicon oxide. A dilute hydrofluoric acid (DHF) clean may be performed within the opening after forming the bird's beaks in the silicon nitride. A memory cell film may be formed on the vertical sidewalls in the memory holes after the DHF clean. The silicon nitride may be sacrificial layers, which may be removed and replaced with conductive material that may serve as control gates for the memory cells.

As will be discussed more fully below, it is possible for a cleaning step (e.g., DHF clean) to cause cavities in the silicon oxide of the vertical sidewalls of the memory holes. These cavities can cause the contour of the memory hole being somewhat wavy (from top to bottom). The memory cell film may form a conformal layer over the vertical sidewalls of the memory hole. Therefore, the contour of the memory cell film may be somewhat wavy, which can impact memory array operation. For example, the wavy memory cell film contour could result in parasitic charge trapping in portions of the memory cell film. The parasitic charge trapping can possibly result in interference between neighboring memory cells.

Embodiments disclosed herein fabricate memory cell films in memory holes formed in layers of silicon oxide and silicon nitride. Embodiments disclosed herein reduce or prevent cavities in the silicon oxide along vertical sidewalls of the memory holes. Embodiments disclosed herein produce a memory hole contour that is straight, or nearly straight, from top to bottom. Embodiments disclosed herein produce a memory cell film that is straight, or nearly straight, from top to bottom in a memory hole. Fabrication techniques disclosed herein are economical, and can easily be integrated into semiconductor fabrication processes. Embodiments disclosed herein result in a memory cell film that is not as susceptible to parasitic charge trapping as a memory cell film formed in a memory hole with a wavy contour. Embodiments disclosed herein fabricate 3D memory in a manner that reduces (or prevents) interference from neighboring memory cells.

One example of a non-volatile storage system that can be fabricated with the technology described herein is a flash memory system that uses the NAND structure, which includes arranging multiple memory cell transistors in series, sandwiched between two select transistors. However, other types of memory can be fabricated with technology described herein.

Figure 1:
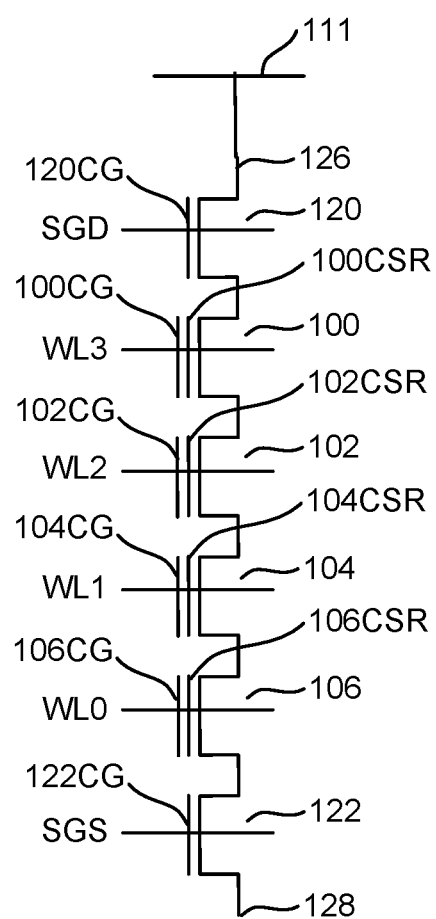
FIG. 1 is a circuit representation of a NAND string.

The memory cell transistors in series and the select transistors are referred to as a NAND string. FIG. 1 is a circuit representation of a NAND string. The NAND string depicted in FIG. 1 includes four memory cell transistors 100, 102, 104 and 106 in series and sandwiched between (drain side) select transistor 120 and (source side) select transistor 122. Select transistor 120 connects the NAND string to a bit line 111. Select transistor 122 connects the NAND string to source line 128. Select transistor 120 is controlled by applying the appropriate voltages to select line SGD. The select line (SGD) is connected to a control gate terminal 120CG of the select transistor 120. Select transistor 122 is controlled by applying the appropriate voltages to select line SGS. The select line (SGS) is connected to a control gate terminal 122CG of the select transistor 122. Note that there may be more than one select transistor at each end of the NAND string, which work together as a switch to connect/disconnect the NAND string to and from the bit line and source line. For example, there may be multiple select transistors in series at each end of the NAND string.

Each of the memory cell transistors 100, 102, 104 and 106 has a control gate (CG) and a charge storage region (CSR). For example, memory cell transistor 100 has control gate 100CG charge storage region 1600CSR. Memory cell transistor 102 includes control gate 102CG and a charge storage region 102CSR. Memory cell transistor 104 includes control gate 104CG and charge storage region 104CSR. Memory cell transistor 106 includes a control gate 106CG and a charge storage region 106CSR. Control gate 100CG is connected to word line WL3, control gate 102CG is connected to word line WL2, control gate 104CG is connected to word line WL1, and control gate 106CG is connected to word line WL0.

Note that although FIG. 1 shows four memory cells in the NAND string, the use of four memory cells is only provided as an example. A NAND string can have fewer than four memory cells or more than four memory cells. The discussion herein is not limited to any particular number of memory cells in a NAND string. One embodiment uses NAND strings with some memory cells are used to store data and one or more of the memory cells are referred to as dummy memory cells because they do not store data.

A typical architecture for a flash memory system using a NAND structure will include many NAND strings. Each NAND string may be connected to the common source line by its source select transistor controlled by select line SGS and connected to its associated bit line by its drain select transistor controlled by select line SGD. Bit lines may be shared with multiple NAND strings. The bit line may be connected to a sense amplifier.

The charge storage region (CSR) may utilize a non-conductive dielectric material to store charge in a non-volatile manner. In one embodiment, a triple layer dielectric formed of oxide-nitride-oxide ("ONO") is sandwiched between a conductive control gate and the memory cell channel. As one example, the ONO is silicon oxide, silicon nitride and silicon oxide. As another example, the ONO may be $Al_2O_3$—SiN—$SiO_2$. In the direction from the control gate toward the NAND channel, the first oxide (e.g., $Al_2O_3$) forms at least a portion of a blocking layer, which blocks un-desirable tunneling of electrons from CSR to control gate or from control gate to CSR. The silicon nitride is a charge trapping layer or charge storage region (CSR), in one embodiment. The second oxide (e.g., $SiO_2$) is tunneling dielectric through which electron can tunnel from the channel to the CSR during programming. The blocking layer can be a stack of dielectrics, e.g. $Al_2O_3$—$SiO_2$ in the direction from control gate toward the NAND channel, in one embodiment. The tunneling layer can be a stack of different dielectric films, e.g. $SiO_2$—SiN—$SiO_2$, in one embodiment. The cell is programmed by injecting electrons from the cell channel (or NAND string channel) into the nitride, where they are trapped and stored in a limited region. This stored charge then changes the threshold voltage of the cell in a manner that is detectable. The cell may be erased by injecting holes into the nitride. Cells may be erased by injecting holes into the nitride where they recombine with electrons, and thereby "cancel" or reduce the stored charge. Cells may be also erased by extracting electrons from the nitride, e.g., by applying an electric field making electrons tunnel from nitride to the channel. Cells may be erased by both these mechanisms combined.

Numerous types of materials can be used for the charge storage regions (CSR). In one embodiment, the charge storage regions are conductive floating gates. As one example, the conductive floating gate is formed from poly-silicon. This may be heavily doped polysilicon. Other types of non-volatile memory technologies can also be used.

Figure 2:
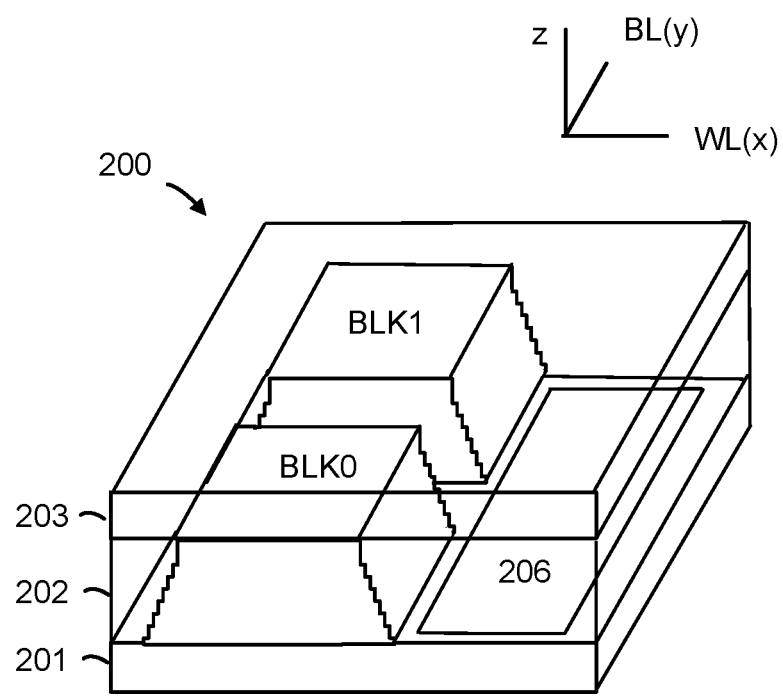
FIG. 2 is a perspective view of a 3D stacked non-volatile memory device.

FIG. 2 is a perspective view of a 3D stacked non-volatile memory device. The 3D memory device 200 includes a substrate 201. In one embodiment, the substrate 201 is formed from silicon. Thus, the substrate 201 may be a semiconductor substrate. The substrate 201 may be a semiconductor wafer. The substrate 201 has a major surface that extends in the x-y plane. On the substrate are example blocks BLK0 and BLK1 of memory cells and a peripheral area 206 with circuitry for use by the blocks. The substrate 201 can also carry circuitry under the blocks, along with one or more lower metal layers which are patterned in conductive paths to carry signals of the circuitry. The blocks are formed in an intermediate region 202 of the memory device. The circuitry associated with operation of the memory cells may be above or within the substrate 201. In one embodiment, the non-volatile memory device is monolithically formed in one or more physical levels of arrays of memory cells having an active area disposed above the substrate 201.

In an upper region 203 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. An x-y-z coordinate system is depicted, showing a y-direction (or bit line (BL) direction), an x-direction (or word line (WL) direction), as well as a z-direction. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 3:
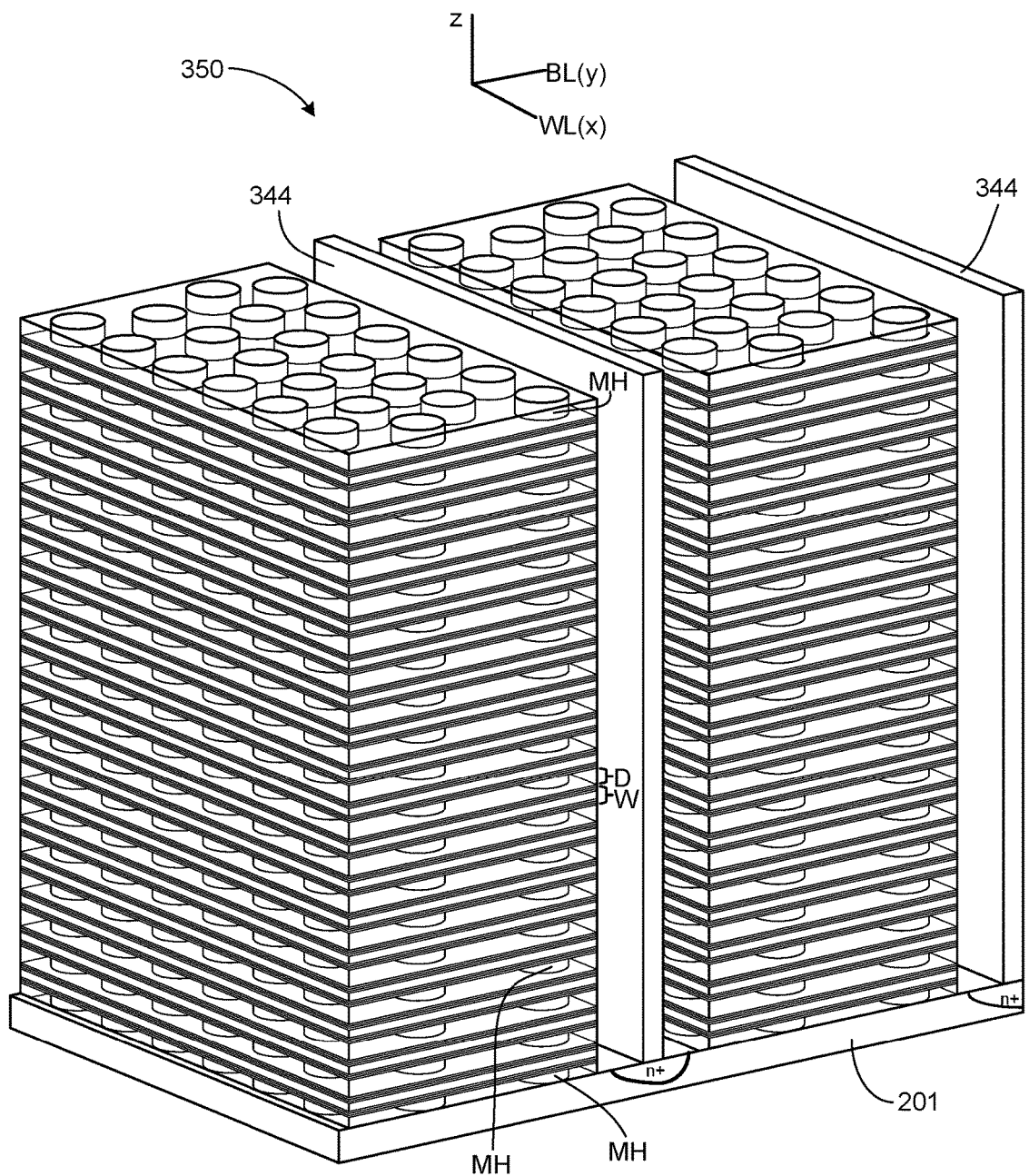
FIG. 3 is a perspective view of a portion of a three dimensional monolithic memory structure.

FIG. 3 is a perspective view of a portion of a three dimensional monolithic memory structure 350, which includes a plurality memory cells. For example, FIG. 3 shows a portion of one block of memory. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or fewer than 108-216 layers can also be used. The alternating dielectric layers and conductive layers are divided into "fingers" by local source lines 344. Note that the local source lines 344 may also be referred to as local interconnects LI. FIG. 3 only shows two fingers and two local interconnects LI. The local source lines 344 are conductive elements. Below and the alternating dielectric layers and word line layers is a substrate 201. Each local source line 344 is in electrical contact with an n+ diffusion region of the substrate 201, in one embodiment. Note that the local source lines 344 each have a major plane that extends in the x-z plane.

Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data.

FIG. 4A is a block diagram explaining one example organization of memory structure 350, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . .

Figure 4B:
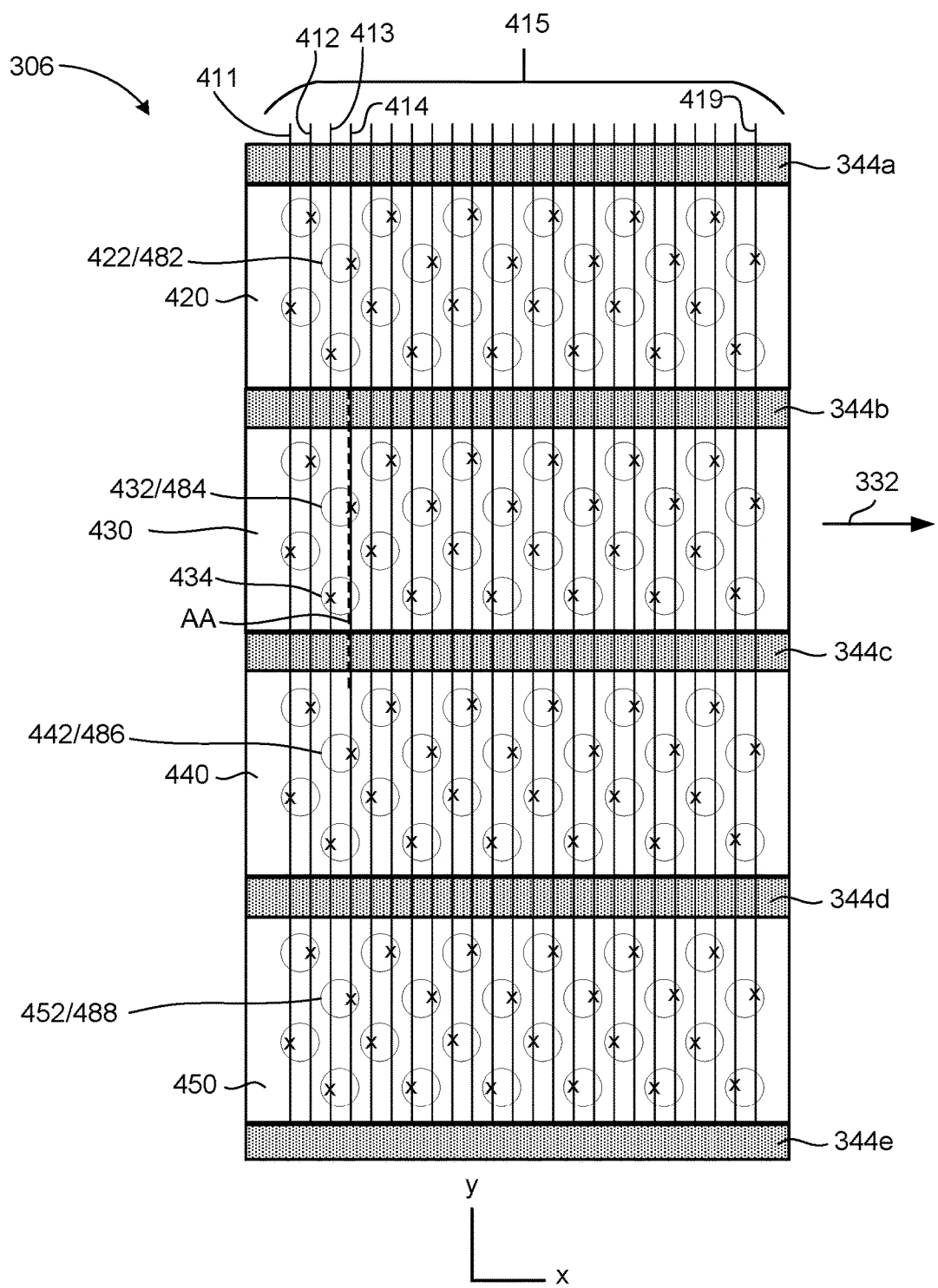
FIG. 4B depicts a plurality of circles that represent the vertical columns.

FIGS. 4B-4E depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local source lines 344a, 344b, 344c, 344d, 344e. Local source lines may also be referred to as "local interconnects". Local interconnects 344 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 4B also shows the vertical columns being staggered. In other embodiments, different patterns of staggering can be used. In some embodiments, the vertical columns are not staggered.

Figure 4C:
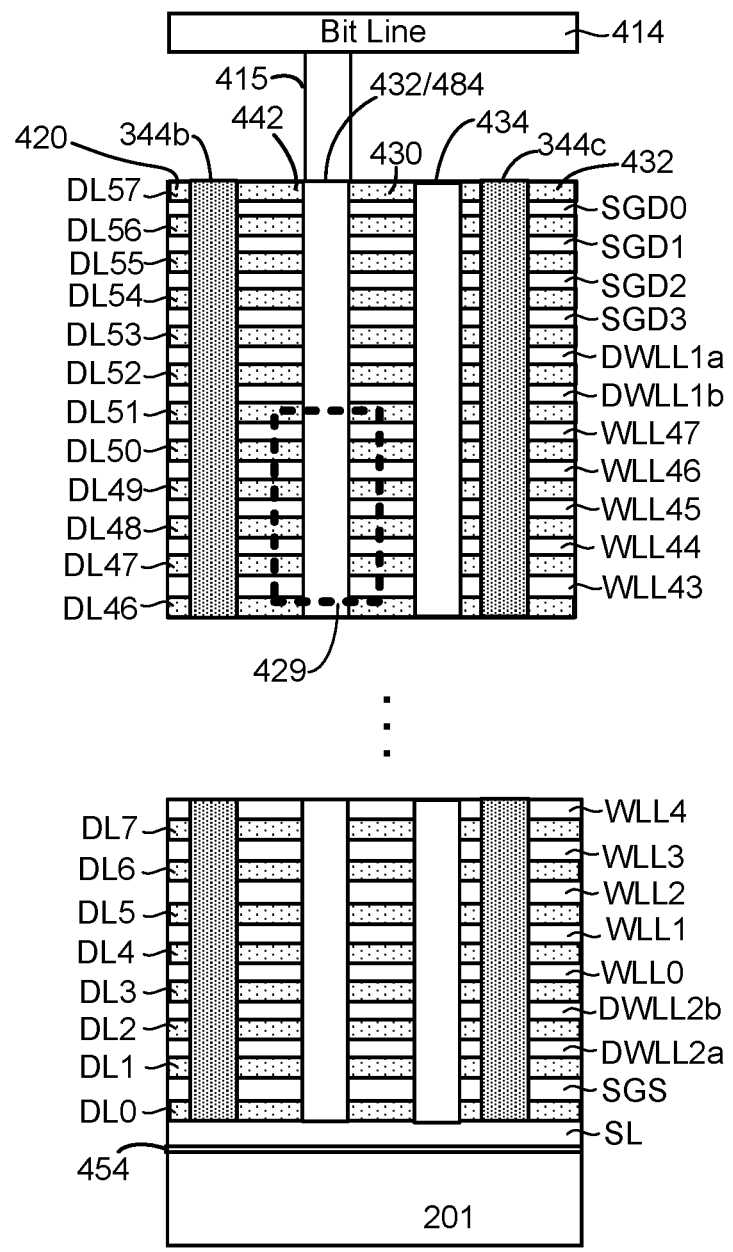
FIG. 4C depicts a portion of an embodiment of three dimensional memory structure showing a cross-sectional view along line AA of FIG. 4B.

FIG. 4C depicts a portion of an embodiment of three dimensional memory structure 350 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; one source side select layer SGS; four dummy word line layers DWLL1a, DWLL1b, DWLL2a and DWLL2b; and forty eight data word line layers WLL0-WLL47 for connecting to data memory cells. Other embodiments can implement more or fewer than four drain side select layers, more than one source side select layer, more or fewer than four dummy word line layers, and more or fewer than forty eight word line layers (e.g., 96 word line layers). Vertical columns 432 and 434 are depicted protruding through the drain side select layers, source side select layer, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The source line (SL) is in direct electrical connection to local source lines 344b, 344c, in this embodiment. The NAND string of vertical column 432 has a source end at a bottom of the stack and a drain end at a top of the stack. As in agreement with FIG. 4B, FIG. 4C show vertical column 432 connected to Bit Line 414 via connector 423.

For ease of reference, drain side select layers SGD0, SGD1, SGD2 and SGD3; source side select layer SGS; dummy word line layers DWLL1a, DWLL1b, DWLL2a and DWLL2b; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL57. For example, dielectric layers DL50 is above word line layer WLL46 and below word line layer WLL47. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DWLL1a, DWLL1b, DWLL2a and DWLL2b connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layer SGS is used to electrically connect and disconnect NAND strings from the source line SL.

Figure 4D:
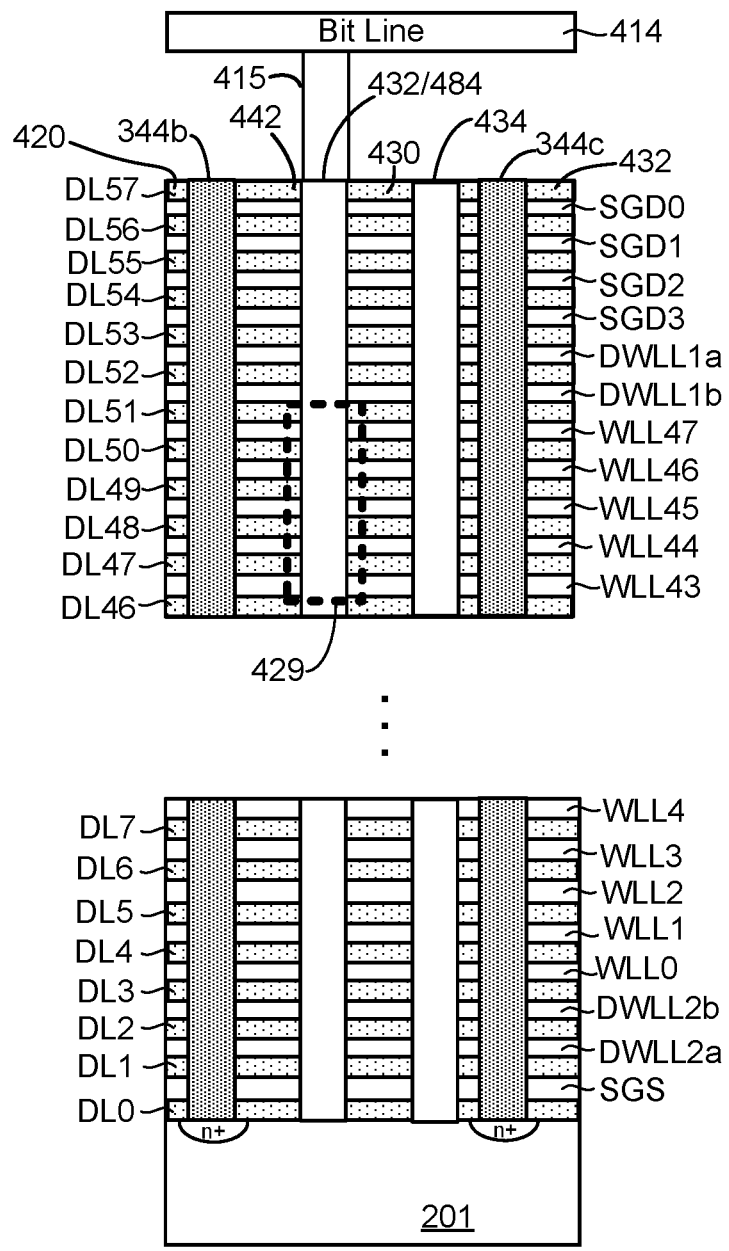
FIG. 4D depicts an alternative to the configuration of FIG. 4C.

FIG. 4D depicts an alternative to the configuration of FIG. 4C. There is not a source line (SL) running horizontally over the substrate 201 in FIG. 4D. Instead, the local source lines 344a, 344c are in direct electrical contact with the substrate 201. The substrate 201 has n+ regions at the contact point.

Figure 4E:
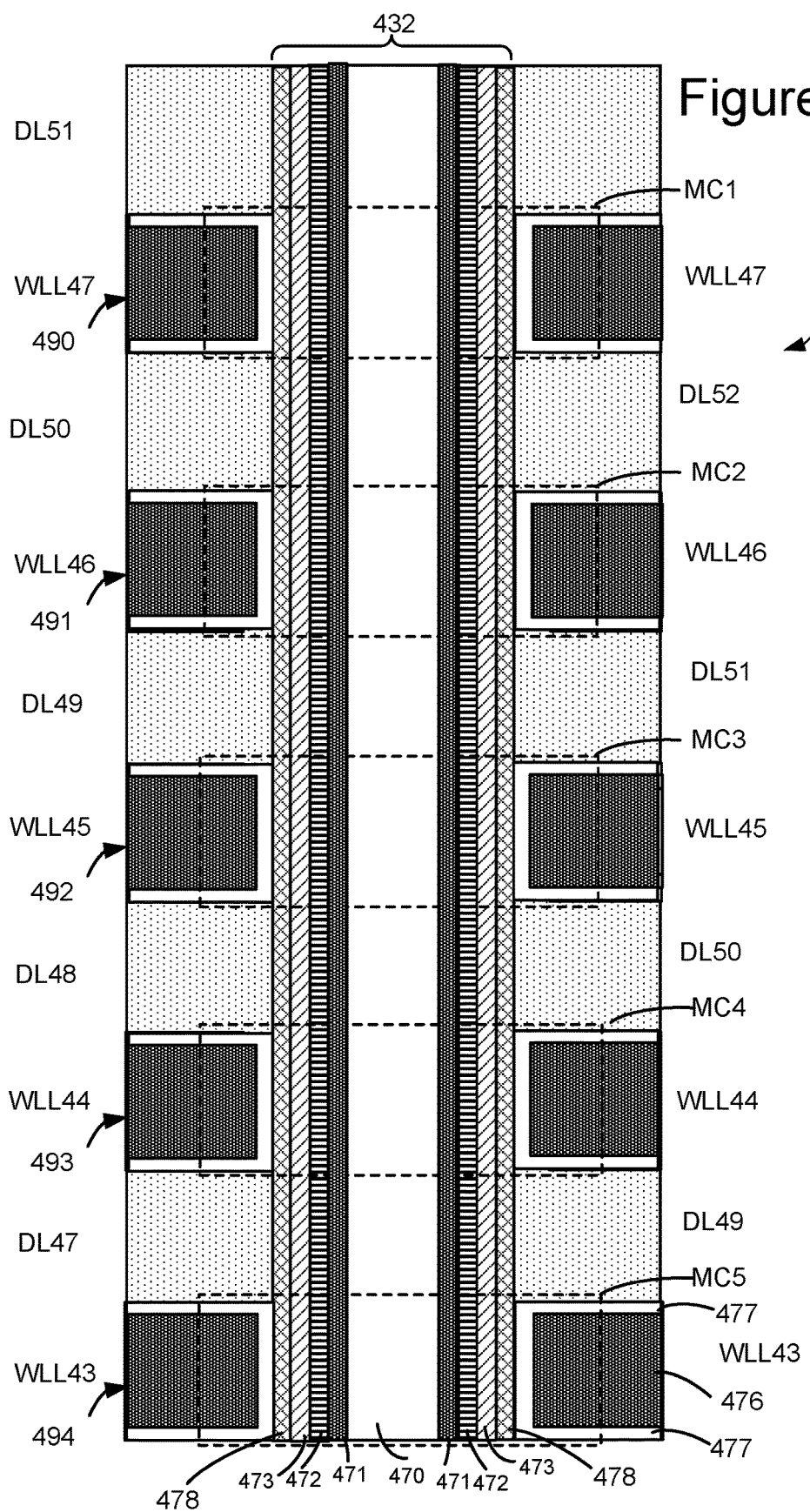
FIG. 4E depicts a cross sectional view of region 429 of FIG. 4C.

FIG. 4E depicts a cross sectional view of region 429 of FIG. 4C (as well as FIG. 4D) that includes a portion of vertical column 432. In one embodiment, the vertical columns are round and include four layers; however, in other embodiments more or fewer than four layers can be included and other shapes can be used. In one embodiment, vertical column 432 includes an inner core layer 470 that is made of a dielectric, such as $SiO_2$. Other materials can also be used. Surrounding inner core 470 is semiconductor channel 471. Semiconductor channel 471 is polysilicon, in one embodiment. Materials other than polysilicon can also be used. Note that it is the channel 471 that connects to the bit line. Surrounding semiconductor channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DL47, DL48, DL49, DL50, and DL51, as well as word line layers WLL43, WLL44, WLL45, WLL46, and WLL47. Each of the word line layers includes a word line region 476 surrounded by an aluminum oxide layer 477. The physical interaction of the word line layers with the vertical column forms the memory cells. Thus, a memory cell, in one embodiment, comprises channel 471, tunneling dielectric 472, charge trapping layer 473, silicon oxide layer (e.g., $SiO_2$) 478, aluminum oxide layer 477 and word line region 476. Together, the aluminum oxide layer 477 and the silicon oxide layer 478 may be referred to as a blocking layer. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Although the example memory system discussed above is a three dimensional memory structure that includes vertical NAND strings with charge-trapping material, other (2D and 3D) memory structures can also be used with the technology described herein. For example, floating gate memories can also be used.

An alternative to the embodiment of FIG. 4E, is to form the aluminum oxide layer 477 entirely within the vertical column 432. Thus, aluminum oxide layer 477 could be formed roughly where silicon oxide layer 478 is depicted. Other layers 471, 472, 473, 478 can be moved inward.

Another alternative to the embodiment of FIG. 4E, is to form the silicon oxide layer 478 entirely outside the vertical column 432. Thus, silicon oxide layer 478 could be formed roughly where aluminum oxide layer 477 is depicted. In this case, aluminum oxide layer 477 can be formed between the silicon oxide layer 478 and word line layer.

In some embodiments, fabricating the 3D memory includes forming alternating layers of silicon oxide and silicon nitride. Then, memory holes are formed in the alternating layers. A memory cell film is formed in the memory holes. The silicon nitride are sacrificial layers, which are removed and replaced with conductive material that serves as control gates for the memory cells. FIGS. 5A-5D depict a close-up view of alternating layers of silicon oxide and silicon nitride with a memory hole. FIGS. 5A-5D will be used to explain a possible problem with formation of memory cell film with memory openings.

Figure 5A:
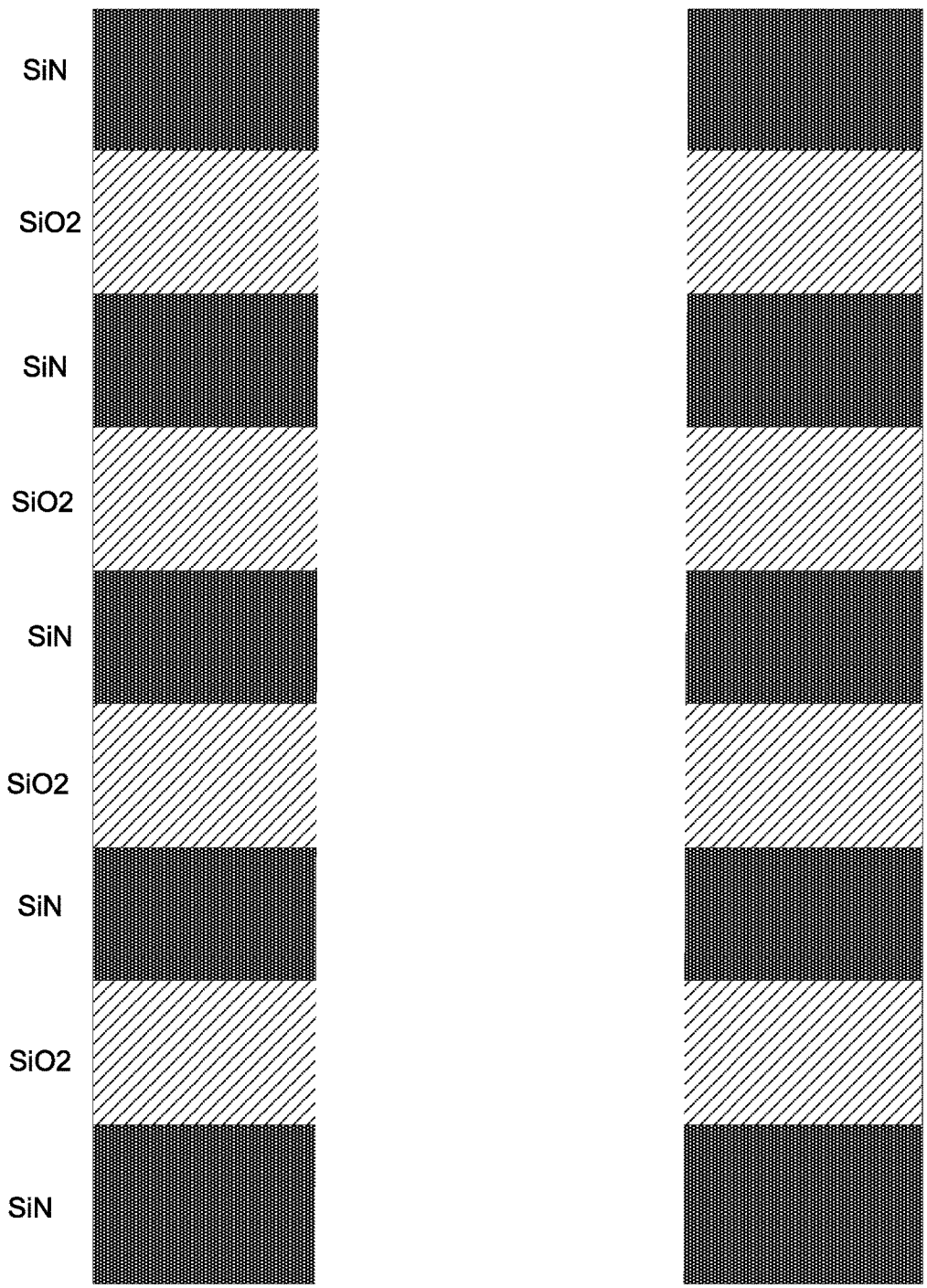
FIGS. 5A-5D illustrate a possible problem with formation of memory cell film with memory openings.

FIG. 5A depicts alternating layers of silicon oxide ($SiO_2$) and silicon nitride (SiN) with a memory hole (MH) formed therein. The alternating layers could be formed over a silicon substrate (not depicted in FIG. 5A). The memory hole could have roughly the shape of a cylinder. After forming the memory hole, it may be desirable to perform a cleaning step in preparation for forming materials within the memory hole. One type of cleaning step is a dilute hydrofluoric acid (DHF) clean (or DHF dip). The DHF clean removes residual oxide. For example, the DHF clean can be used to remove silicon oxide from a surface of silicon such as, the silicon substrate. However, the DHF clean may also etch exposed portions of the silicon oxide on vertical sidewalls of the memory holes.

Figure 5B:
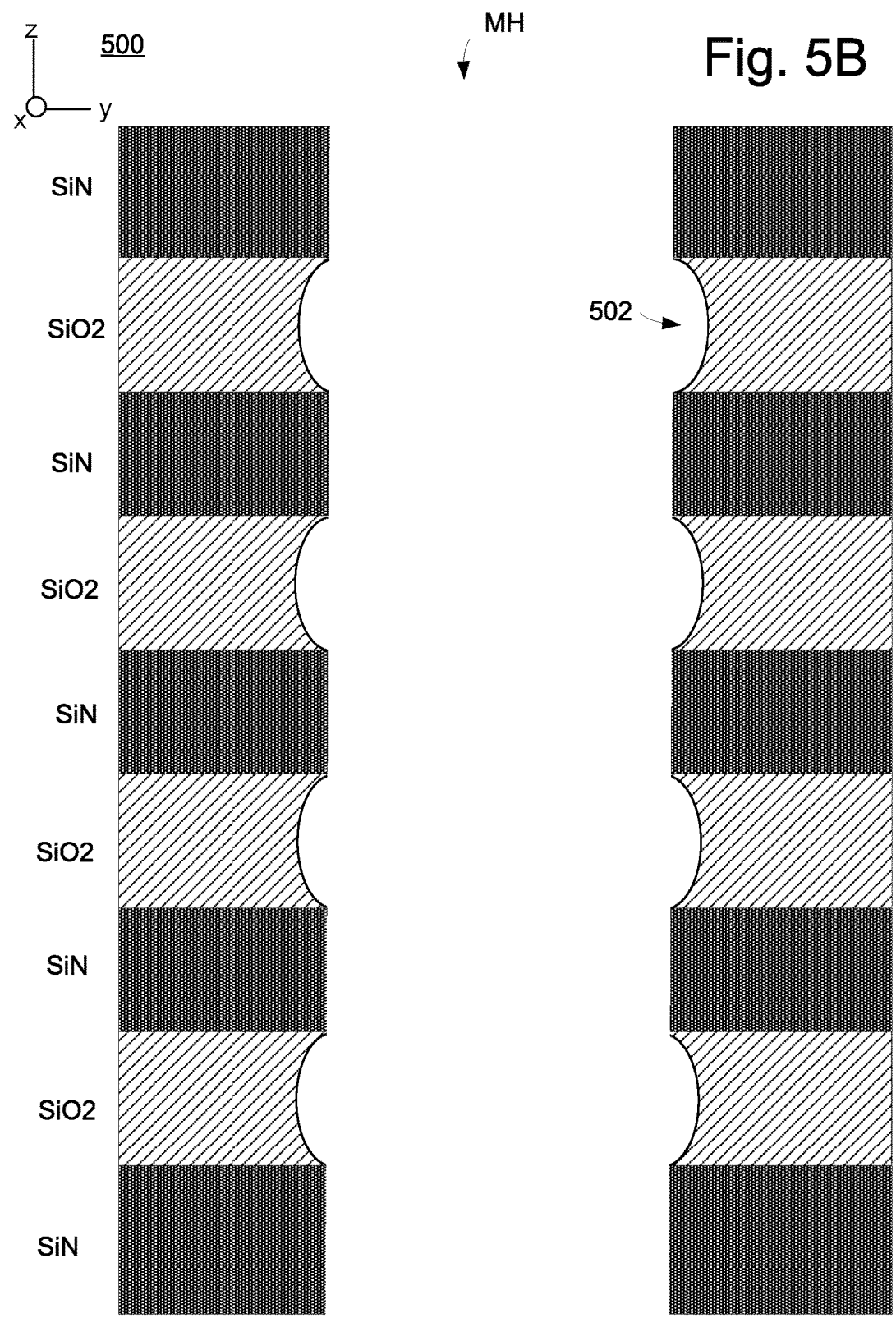

FIG. 5B shows cavities 502 that could form in the silicon oxide as a result of the DHF clean. As noted above, the intent of the DHF clean may be to clean oxide from a silicon surface. Thus, the cavities 502 may be an unintentional result of the DHF clean. In this example, the cavities leave the silicon oxide with a convex shape. This shape of the cavities 502 may be due to somewhat slower etching at the interface between silicon oxide and silicon nitride. Note that the DHF clean may could also etch the silicon nitride to a small extent. However, the DHF clean etches the silicon oxide at a faster rate than the silicon nitride. The vertical sidewall of the memory hole has a "wavy" contour in the direction from top to bottom.

Figure 5C:
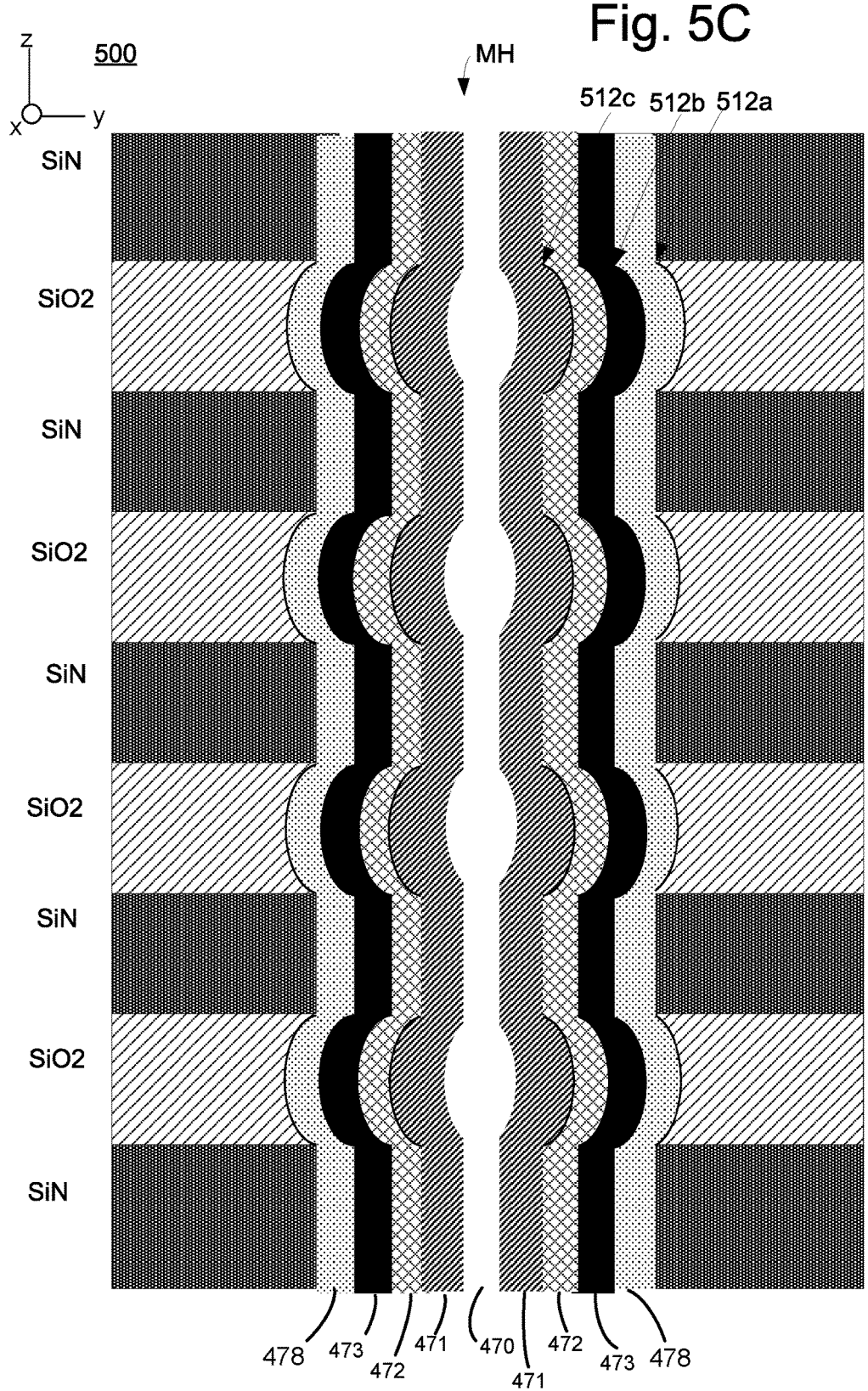

FIG. 5C shows a memory cell film formed in the memory hole after the DHF clean. For the sake of comparison, the layers of memory cell film in FIG. 5C, are similar to those depicted in FIG. 4E. Thus, FIG. 5C depicts core 470, channel 471, tunneling dielectric 472, charge trapping layer 473, and silicon oxide layer (e.g., $SiO_2$) 478. Layers 417, 472, 473, 478 may be referred to as a "memory cell film" in this context.

When silicon oxide layer 478 is deposited, it may form a conformal layer over the vertical sidewalls of the memory hole. Because of the cavities 502 in the silicon oxide of the vertical sidewall of the memory hole, silicon oxide layer 478 may have a discontinuity 512a at each interface between a silicon oxide layer and a silicon nitride layer. Likewise, when charge trapping layer 473 is deposited, it may form a conformal layer over silicon oxide layer 478. Because of the discontinuity 512*a* in silicon oxide layer 478, charge trapping layer 473 may have a discontinuity 512*b* at each interface between a silicon oxide layer and a silicon nitride layer. Likewise, when tunneling dielectric layer 472 is deposited, it may form a conformal layer over charge trapping layer 473. Because of the discontinuity 512*b* in charge trapping layer 473, dielectric layer 472 may have a discontinuity 512*c* at each interface between a silicon oxide layer and a silicon nitride layer. Moreover, the memory cell film has a wavy contour.

Figure 5D:
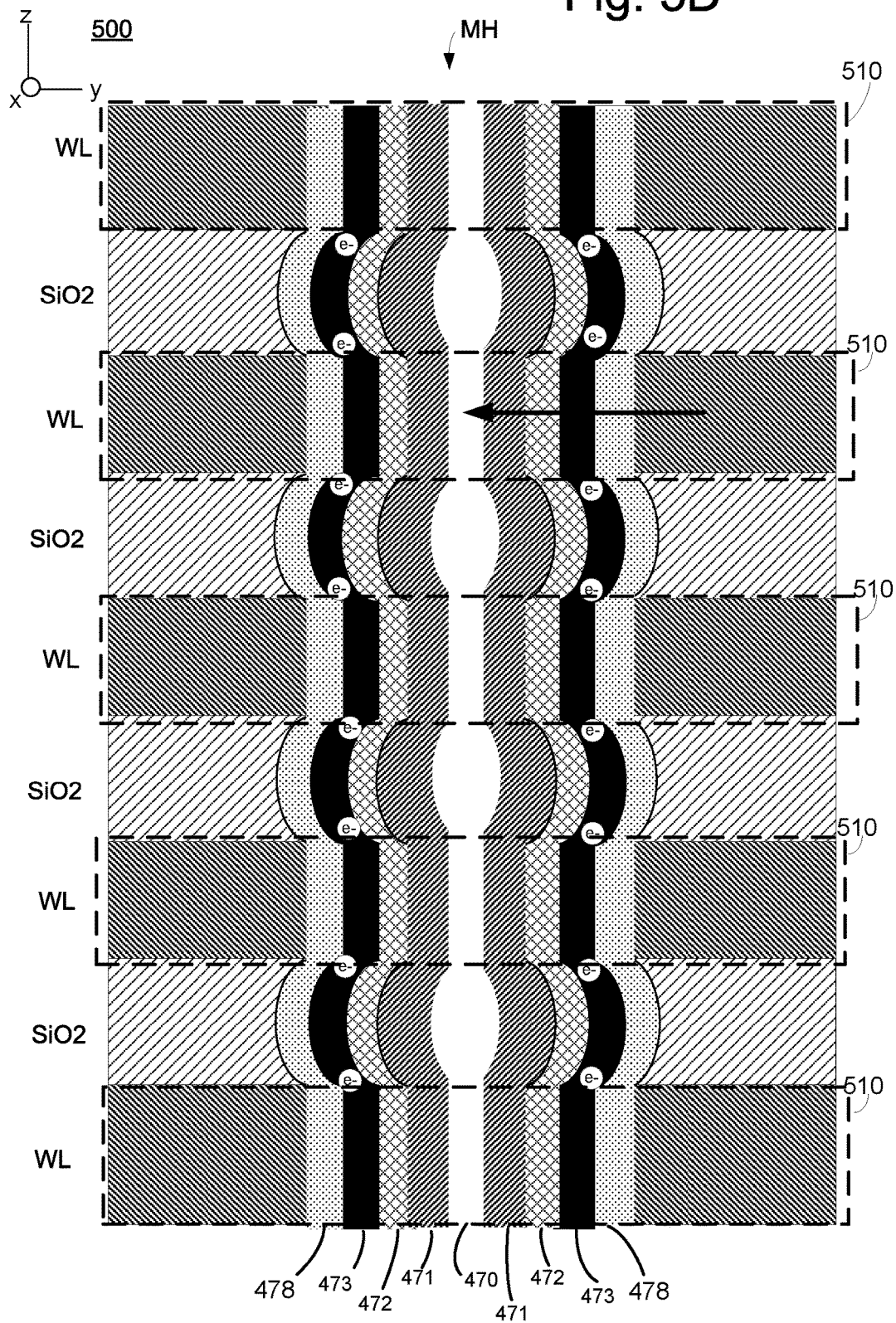

FIG. 5D shows the stack after the sacrificial silicon nitride has been replaced by tungsten for word lines (or control gates). The word lines (WL) could be formed from a conductive material other than tungsten. Also, there could be a blocking layer outside of the memory holes, such as the aluminum oxide region 477 depicted in FIG. 4E. Thus, the memory cell film could be formed from different layers than depicted in FIG. 5D.

A number of memory cells 510 are depicted. During operations such as programming, reading, or erase, a first voltage may be applied to the word line (WL) and a second voltage applied to the channel 471. For some operations, the WL voltage is higher than the channel voltage. However, the channel voltage could be higher than the WL voltage. In either case, the voltages may result in an electrical field. The arrow in FIG. 5D represents a direction of an electric field for when the higher voltage is applied to the word line (as in, for example, a programming or read operation). The wavy contour of the memory cell film can result in a "fringe" electric field, as well. The fringe electric field is not depicted in FIG. 5D.

FIG. 5D depicts a few trapped parasitic charges in the charge trapping layer 473 (represented by electrons, or "e−"), which could result from the fringe electric field. Such trapped parasitic charges may occur during operations such as programming, reading, or erase. Note that the actual number of trapped electrons may be quite different from representation in FIG. 5D. Also, the distribution of trapped parasitic charges is not necessarily uniform. For example, there may be a different number of electrons for different memory cells. Also, there may be electrons in the charge trapping layer 473 in the region immediately adjacent to the word lines, which result from programming the memory cells. However, those electrons are not depicted in FIG. 5D.

The trapped parasitic charges may impact the threshold voltage of a memory cell. Under one scenario, a memory cell that is programmed to a high threshold voltage may be an "attacker" and a memory cell that is programmed to a low threshold voltage may be a "victim". For example, the threshold voltage of the victim memory cell may be increased due to the trapped parasitic charges near the victim memory cell. This may be referred to as neighbor word line interference.

Figure 6:
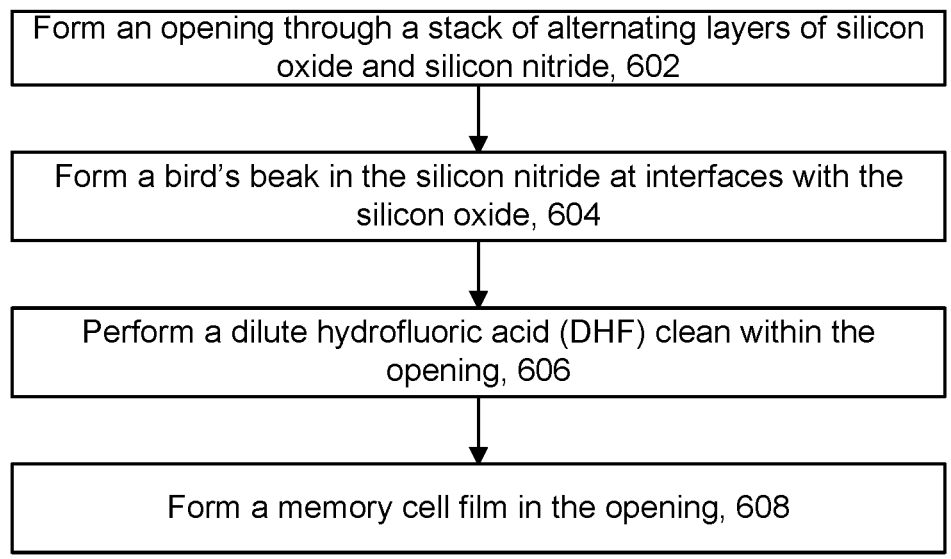
FIG. 6 is a flowchart of one embodiment of a process 600 of fabricating 3D non-volatile storage.

FIG. 6 is a flowchart of one embodiment of a process 600 of fabricating 3D non-volatile storage. The process 600 could be used to fabricate 3D NAND memory, but is not so limited. In general, the process 600 can be used to form 3D memory in which a memory cell film is formed on a vertical sidewall of a memory hole, which is formed in alternating layers of silicon oxide and silicon nitride. FIGS. 7A-7E depict details of during embodiments of process 600.

Figure 7A:
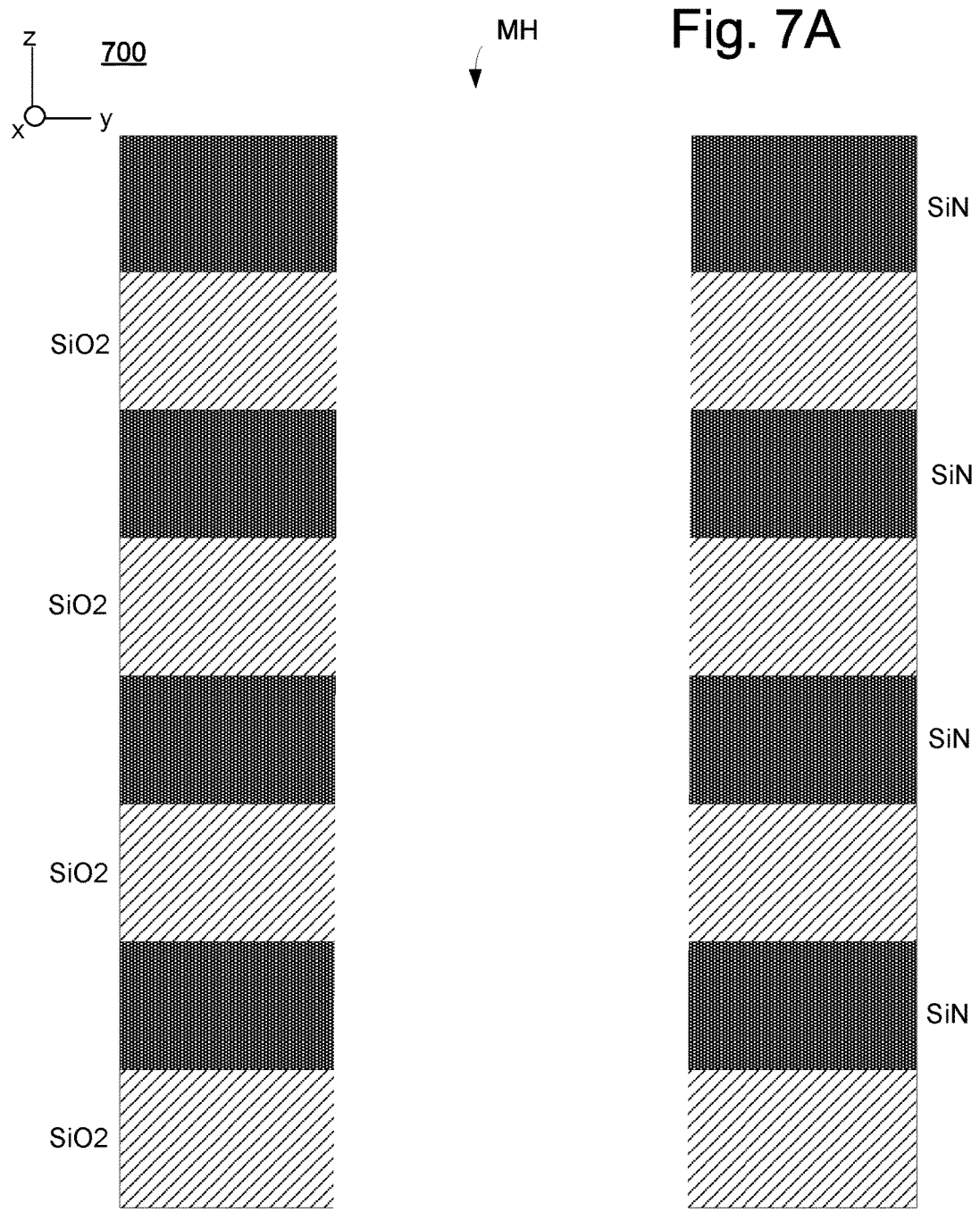

In step 602, an opening is formed through a stack of alternating layers of silicon oxide and silicon nitride. FIG. 7A depicts results after one embodiment of step 602. A stack 700 of alternating layers of silicon oxide (SiO$_2$) and silicon nitride (SiN) is depicted. An opening (MH) is depicted. The opening is referred to as a memory hole opening, in one embodiment.

The stack 700 could be formed over a semiconductor (e.g., silicon) substrate (not depicted in FIG. 7A). In one embodiment, the semiconductor substrate has a major surface, above which the stack is formed. The alternating layers of silicon oxide and silicon nitride extend horizontally with respect to the major surface of the semiconductor substrate, in one embodiment. In FIG. 7A, the alternating layers extend in the x-y plane.

The opening extends in the y-direction (or vertically with respect to the alternating layers). The opening has a vertical sidewall defined by the alternating layers of silicon oxide and silicon nitride. The opening is cylindrical, in one embodiment. The horizontal cross section of the cylindrical opening may be, but is not limited to, circular, oval, or elliptical. The opening is not required to be cylindrical. For example, the opening could have a prismatic shape. A prismatic opening, as defined herein, has a horizontal cross section that is an n-sided polygon. A prismatic opening may have an n-sided polygonal base, another congruent base (with the same rotational orientation) and n other faces joining the two bases (the faces may be parallelograms). The value for "n" may be three or more. The diameter of the opening (cylindrical, prismatic, etc.) can vary somewhat from top to bottom of the stack. For example, it is possible for the opening to be more narrow at the bottom of the stack.

Note that step 602 typically includes forming many openings in the stack 700. In one embodiment, the openings are formed by using a mask. In the layout for the mask, there may be rectangles (or squares) for the openings. However, due to lithographic and processing effects, the horizontal cross section of the memory hole openings may end up being circular, or close to circular, in horizontal cross section. Thus, the opening (from top to bottom) is not necessarily a perfect cylinder or a perfect prism. For example, the horizontal cross section could have some portions that are a straight line (or very close thereto) and some portions that are an arc (or very close thereto).

In step 604, a bird's beak in formed in silicon nitride at interfaces with the silicon oxide. In one embodiment, the bird's beak is formed by performing a SiN wet etch in the opening. The SiN etch is a phosphoric acid etch, in one embodiment. In one embodiment, the bird's beak is formed by oxidizing the SiN in the opening. In one embodiment, step 604 performs a wet oxidation. In one embodiment, step 604 performs a dry oxidation.

Figure 7B:
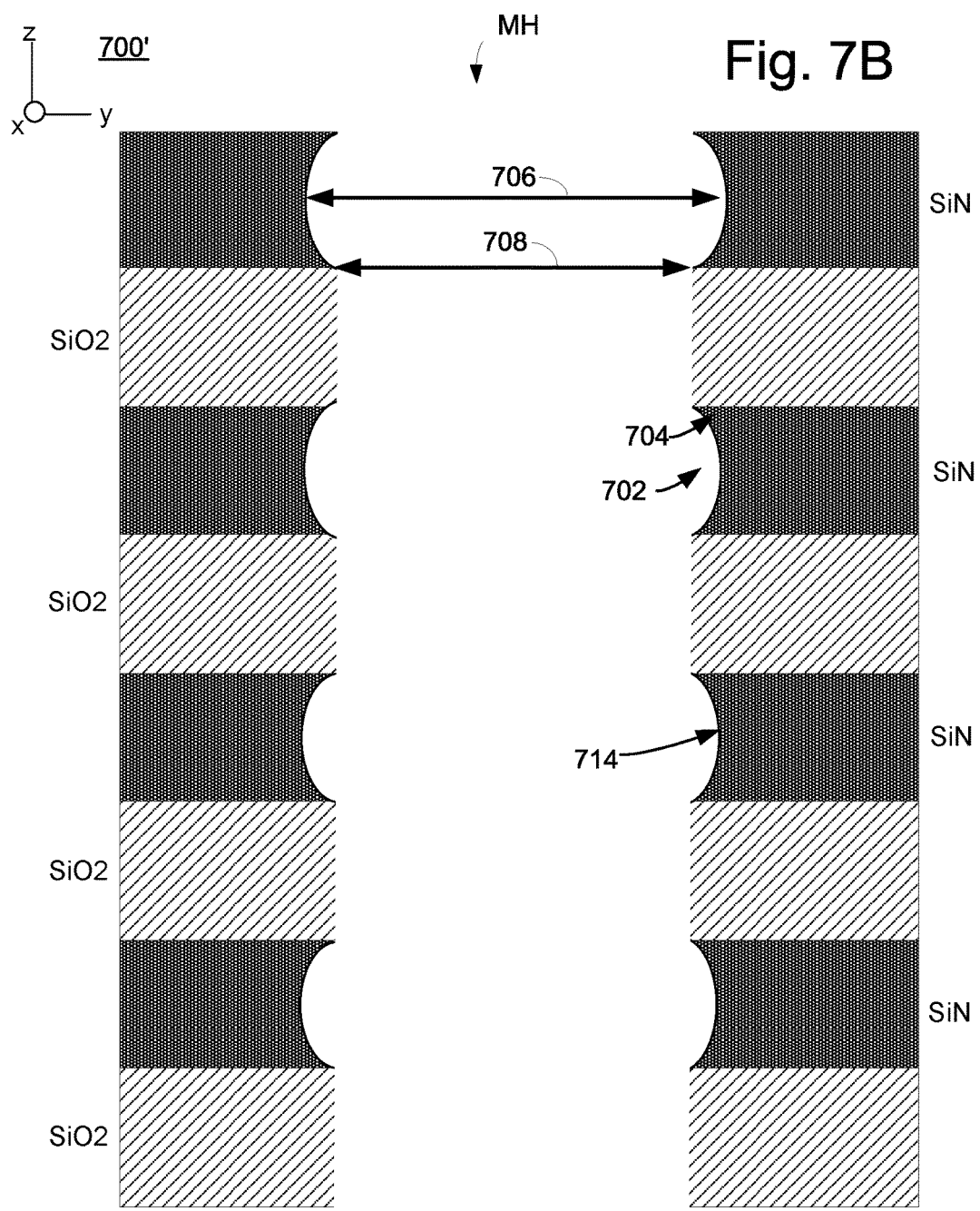

FIG. 7B shows results after one embodiment of step 604. FIG. 7B depicts a stack 700' of alternating layers of silicon oxide (SiO$_2$) and silicon nitride (SiN) after convex portions of the silicon nitride have been removed. In this embodiment, a convex portion of the SiN at the vertical sidewall of the memory hole (MH) has been removed. Removing the convex portion of the SiN leaves a concave surface 714 in the SiN. Removing the convex portion of the SiN has creates a cavity 702 where there formerly was SiN. The cavity 702 may be referred to as a concave cavity or concavity.

In one embodiment, the concavity 702 causes the diameter of the opening to increase. For example, line 706 represents the diameter of the opening (MH) where the concavity 702 is at its greatest extent. Line 708 represents the diameter of the opening where the concavity 702 is at its smallest extent. The opening, for a given layer of silicon nitride, has a larger diameter where the concavity 702 is at its greatest extent (relative to the diameter for that layer of silicon nitride at the location where the concavity 702 is at its smallest extent). Note that the opening might taper from top to bottom. Thus, the diameter of the opening where the concavity 702 is at its smallest extent could be different for different layers.

Each of the SiN regions has a bird's beak 704 at the interface between the SiN and each of the adjacent layers of the $SiO_2$. The bird's beak 704 becomes thinner in the z-direction closer to the vertical sidewall of the memory hole. The bird's beak 704 may taper, wherein the silicon nitride gets thinner in the z-direction closer the surface of the vertical sidewall. FIG. 7B shows that the y-z cross section of the bird's beak 704 appears to come to a point at the surface of the vertical sidewall. This point may extend in the x-y plane around the entire circumference of the memory hole, and may be referred to as a tip of the bird's beak. The tip may have a pointed or a rounded end.

Figure 7C:
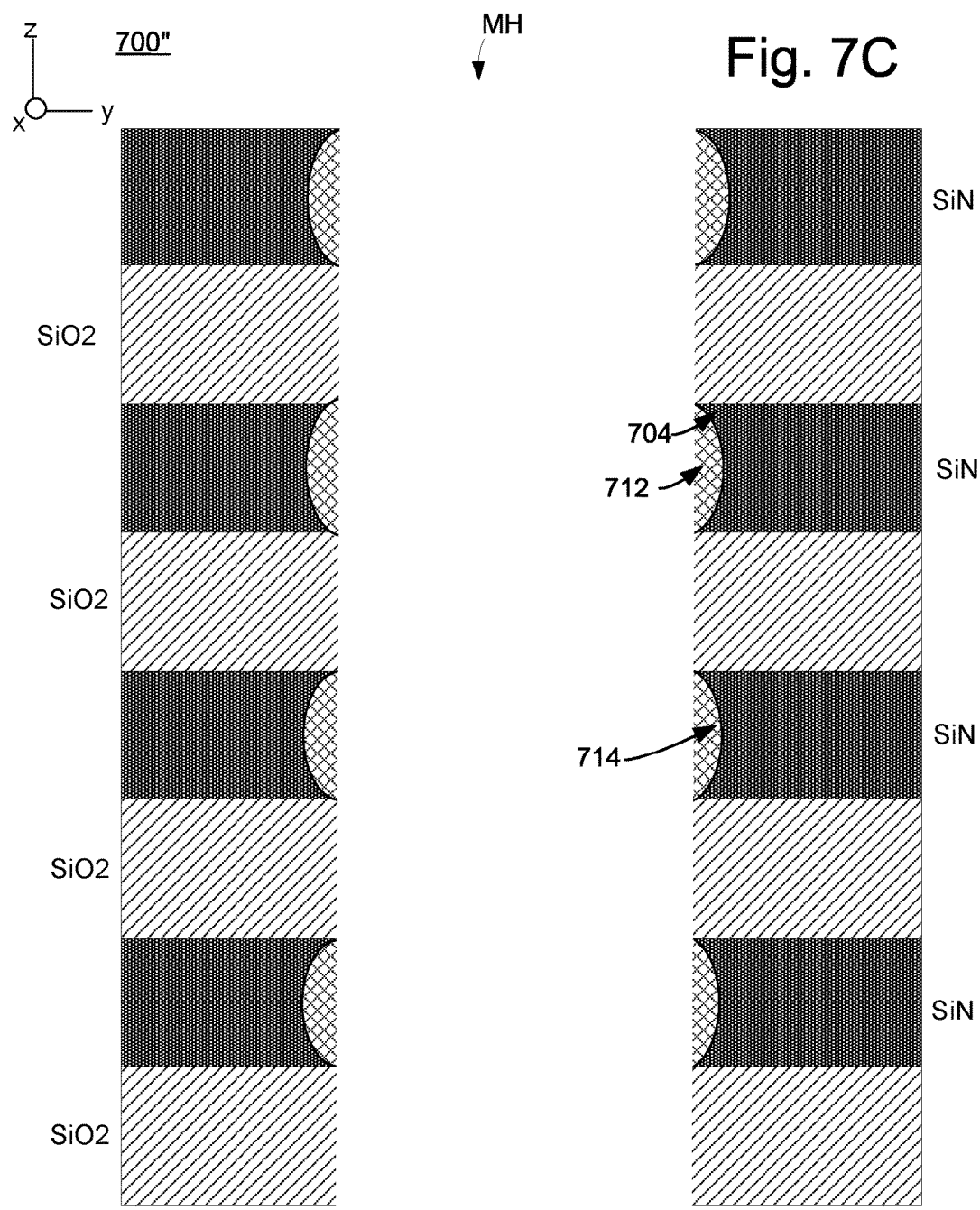

FIG. 7C shows results after another embodiment of step 604. FIG. 7C depicts a stack 700" of alternating layers of silicon oxide ($SiO_2$) and silicon nitride (SiN) after convex portions of the silicon nitride have been oxidized. In this embodiment, a convex portion of the SiN at the vertical sidewall of the memory hole (MH) has been oxidized. Oxidizing the portion of the SiN has created oxidized SiN 712 where there formerly was SiN. The portion of the silicon nitride that has not been oxidized has a concave surface 714. Each of the SiN regions has a bird's beak 704 at the interface between the SiN and the $SiO_2$. The bird's beak 704 may have similar characteristics as the bird's beak 704 of the example in FIG. 7B.

Step 606 is performing a dilute hydrofluoric acid (DHF) dip (or clean) within the opening. FIG. 7D depicts results after embodiments of step 606. FIG. 7D depicts a stack 700 of alternating layers of silicon oxide ($SiO_2$) and silicon nitride (SiN) after the DHF clean. The results in FIG. 7D may be obtained after either the embodiment in which the SiN wet etch was performed (e.g., FIG. 7B), or the embodiment in which the SiN was oxidized (e.g., FIG. 7C).

FIG. 7D shows that the opening (MH) has a contour in which the vertical sidewall is nearly flat. For example, there is very little rounding (or very little curvature) in the z-direction in the SiN portions of the vertical sidewalls, and there is little rounding (or very little curvature) in the z-direction in the $SiO_2$ portions of the vertical sidewalls. There may be a very small recess 722 in respective layers of the SiN along the vertical sidewalls. However, the recess 722 in the SiN is much smaller than the cavity 702 depicted in FIG. 7B. There may be a very small recess 724 in respective layers of the $SiO_2$ along the vertical sidewalls. However, the recess 724 in the SiN is much smaller than the cavity 502 depicted in FIG. 5B. Thus, the process 600 results in a much better contour for the opening than the example of FIG. 5B.

A possible reason for the better contour for the opening (MH) is as follows, with respect to the embodiment in which the SiN wet etch was performed. The DHF clean may preferentially etch silicon oxide over silicon nitride. This may be a fairly strong preference, although some silicon nitride may be etched. The silicon nitride at the birds' beak 704 may etch faster (during the DHF clean) than other exposed portions of the silicon nitride. This helps to flatten the contour of the silicon nitride, relative to the example of FIG. 7B.

Also, the silicon oxide may develop a tip (or sharp corner) at the interface to the silicon oxide when the bird's beak 704 is etched away. Hence, this can help to increase the etch rate of the silicon oxide near the interface to the silicon nitride. This helps to prevent a cavity from forming in the silicon oxide (or at least reduces the depth of the cavity). Hence, the contour of the silicon oxide is improved relative to, for example, the example of FIG. 5B.

A possible reason for the better contour for the opening (MH), with respect to the embodiment in which the SiN was oxidized, is as follows. As noted, the DHF clean may preferentially etch silicon oxide over silicon nitride. However, because a portion of the silicon nitride was oxidized, the oxidized portion may etch faster than silicon nitride that is not oxidized. Again, the silicon nitride at the birds' beak 704 may etch faster (during the DHF clean) than other exposed portions of the silicon nitride. The foregoing helps to remove the oxidized portion of the silicon nitride 712 and to flatten the contour of the un-oxidized silicon nitride, relative to the example of FIG. 7C.

As with the example of the SiN wet etch, the silicon oxide may develop a tip (or sharp corner) at the interface to the silicon oxide when the bird's beak 704 is etched away for the example in which the silicon nitride was oxidized. Hence, this can help to increase the etch rate of the silicon oxide near the interface to the silicon nitride. This helps to prevent a cavity from forming in the silicon oxide (or at least reduces the depth of the cavity). Hence, the contour of the silicon oxide is improved relative to, for example, the example of FIG. 5B.

Figure 7E:
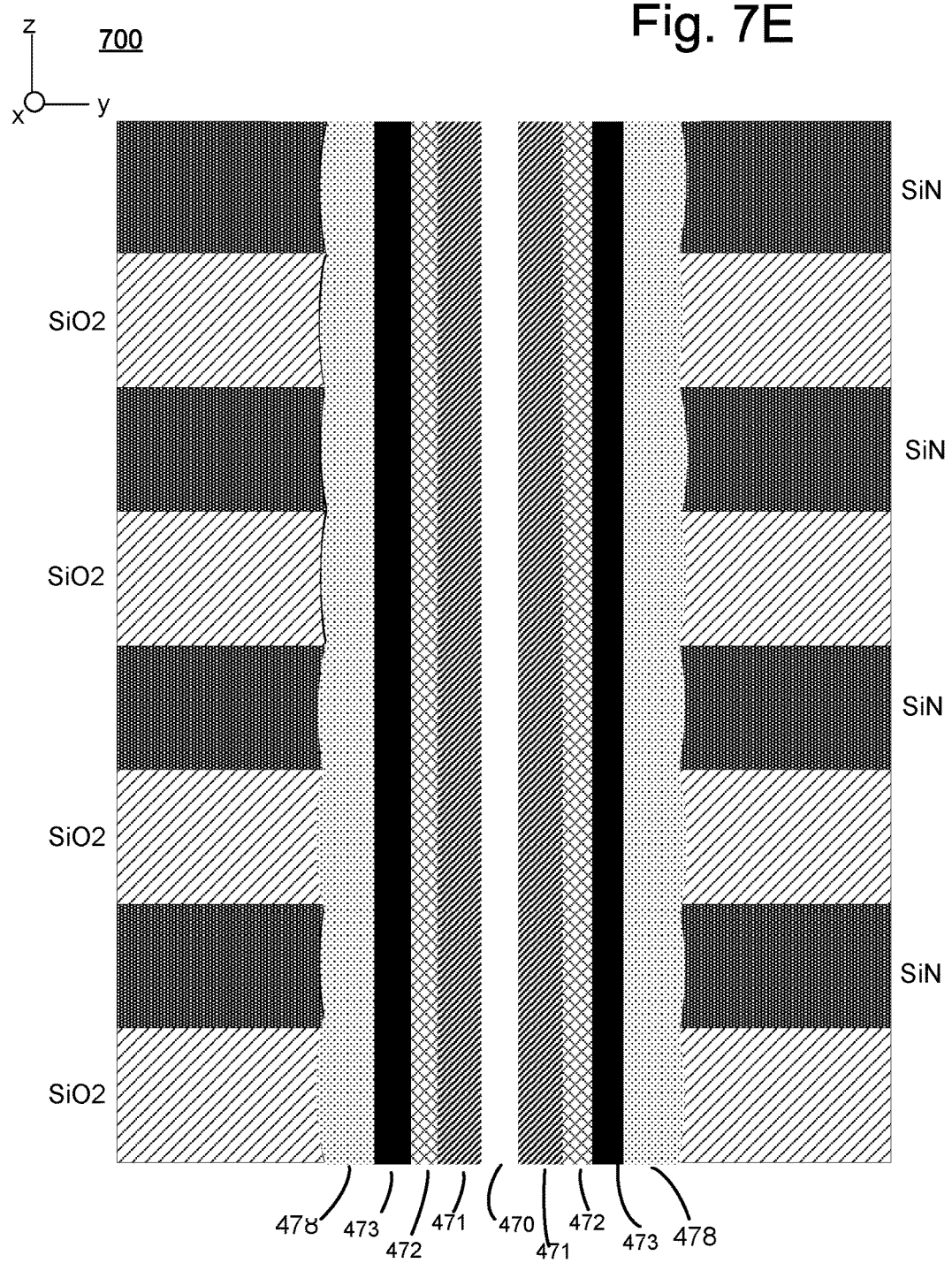

Step 608 is forming a memory cell film in the opening. FIG. 7E depicts results after step 608. In this example, the memory cell film comprises core 470, channel 471, tunneling dielectric 472, charge trapping layer 473, and silicon oxide layer (e.g., $SiO_2$) 478. The memory cell film could comprise different layers of material. One option is for silicon oxide layer (e.g., $SiO_2$) 478 to be outside of the memory hole, rather than inside. The memory cell film has a straight, or nearly straight, contour in the z-direction. This prevents or reduces charges from becoming trapped in charge trapping layer 473. Moreover, neighbor word line interference is prevented or reduced. Note that the silicon nitride may be replaced by conductive material for word lines (or control gates).

Figure 8:
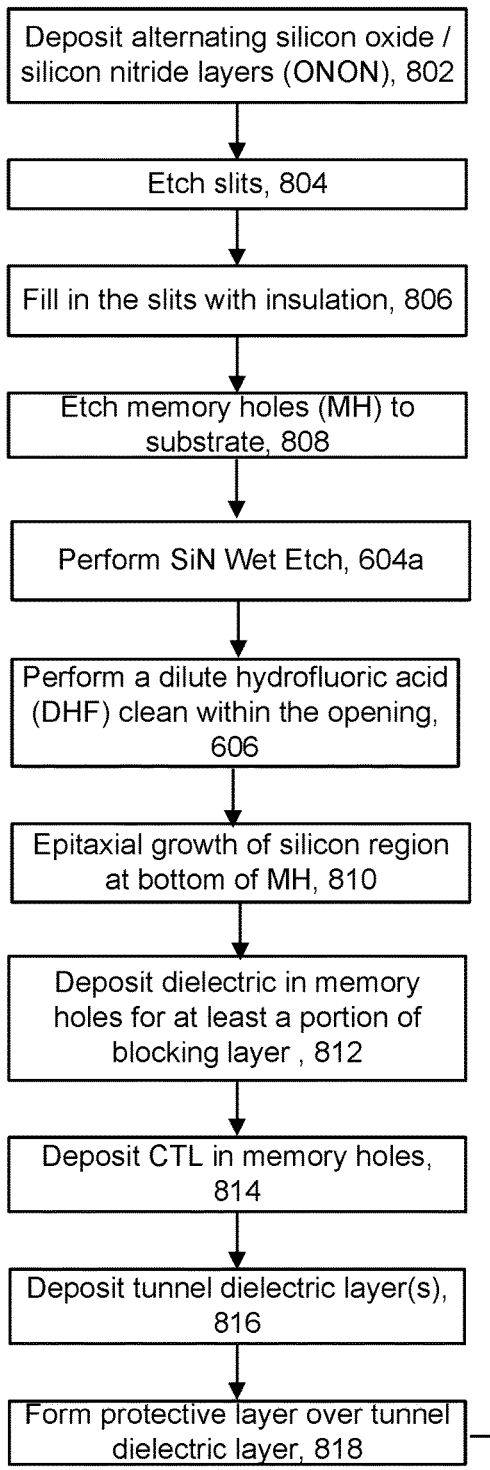
FIG. 8 is a flowchart of one embodiment of a process 800 of forming memory cell film in memory holes in a stack of alternating layers of silicon oxide and silicon nitride.
Figure 8:
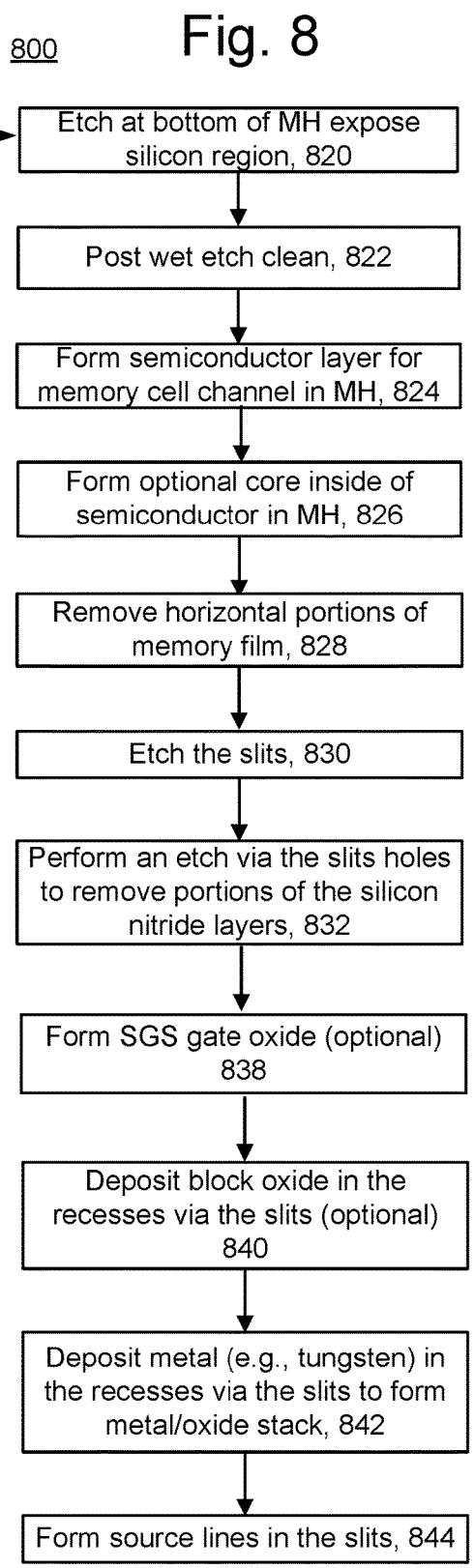

FIG. 8 is a flowchart of one embodiment of a process 800 of forming memory cell film in memory holes in a stack of alternating layers of silicon oxide and silicon nitride. The process 800 provides further details of one embodiment of the process 600 of FIG. 6. FIGS. 9A-9I depict results after various steps of process 800 of FIG. 8. FIGS. 9A-9I depict an example similar to the embodiment of FIG. 4D. In process 800, the memory cell film may be used to form NAND strings. The process 800 could be adapted to form other types of memory cells having a memory cell film formed in a memory hole.

In FIG. 8, steps need not necessarily be performed as discrete steps in the order indicated. Various modifications can be made. Moreover, other steps which are known from the art of semiconductor fabrication but are not explicitly depicted here may also be performed. FIG. 8 represents a "word line last" technique in which the word lines are formed after forming the NAND strings. For example, after forming the NAND strings, sacrificial silicon nitride may be replaced, at least in part, with metal.

Prior to process 800, below-stack circuitry and metal layers may be formed in the substrate 201. Various circuits may be formed in the substrate 201. For example, a metal layer M0 can be used, e.g., for power line and global control signals, and a metal layer M1 can be used, e.g., for bit line and bus signals. In some cases, to make signal routing easier and to save area, a third metal (M2) can also be used, e.g., a total of three (or more) metal layers under the array. The metal layers can be fabricated from a patterned metal film. For example, aluminum can be used for the top metal layer, while the other layers are tungsten. Potentially, copper can be used instead of aluminum for upper layer, using a corresponding integration scheme. For silicidation, Ni, Ti, Co or W can be used, for instance. Note that it is not required to form circuits in the substrate 201. Also, at least some of the circuits can be formed over top of the array after process 800 is complete. For example, the aforementioned metal layers M0, M1 and optionally, M2 can be formed over the memory array.

Step 802 includes depositing alternating silicon oxide ($SiO_2$)/silicon nitride (SiN) layers above the substrate 201. The silicon nitride is a sacrificial layer, which will be replaced in part by material to form a portion of the blocking layer and in part by metal to form word lines (as well as a source select line (SGS), and a drain select line (SGD or SG). The silicon oxide will be used for the insulating layers between the metal word (and select) lines. Other insulators could be used instead of silicon oxide. Other sacrificial materials could be used instead of silicon nitride. Step 802 is one embodiment of step 802 from process 800 of FIG. 8, which is forming horizontal layers above a semiconductor substrate.

Step 804 includes etching slits in the alternating silicon oxide ($SiO_2$)/silicon nitride (SiN) layers. Step 806 includes filling in the slits with insulation. Note that later in process 800 at least a portion of this insulation will be removed. These slits may eventually be used as the second openings referred to in process 800. Thus, these slits can have a shape similar to the local source lines 344 depicted in FIG. 3. Note that such slits could extend for the entire length of a block.

Step 808 includes etching memory holes (MH) in the alternating layers of silicon nitride and silicon oxide. Reactive ion etching can be used to etch the memory holes. In the memory array area, the memory holes are placed densely. For example, the memory holes can have a diameter of 70-110 nanometers (nm) ($70-110\times10^{-9}$ meters). This is an example range; other ranges could be used. Also note that the diameter could vary from top to bottom. Step 808 is one embodiment of step 804 from process 800 of FIG. 8.

Figure 9A:
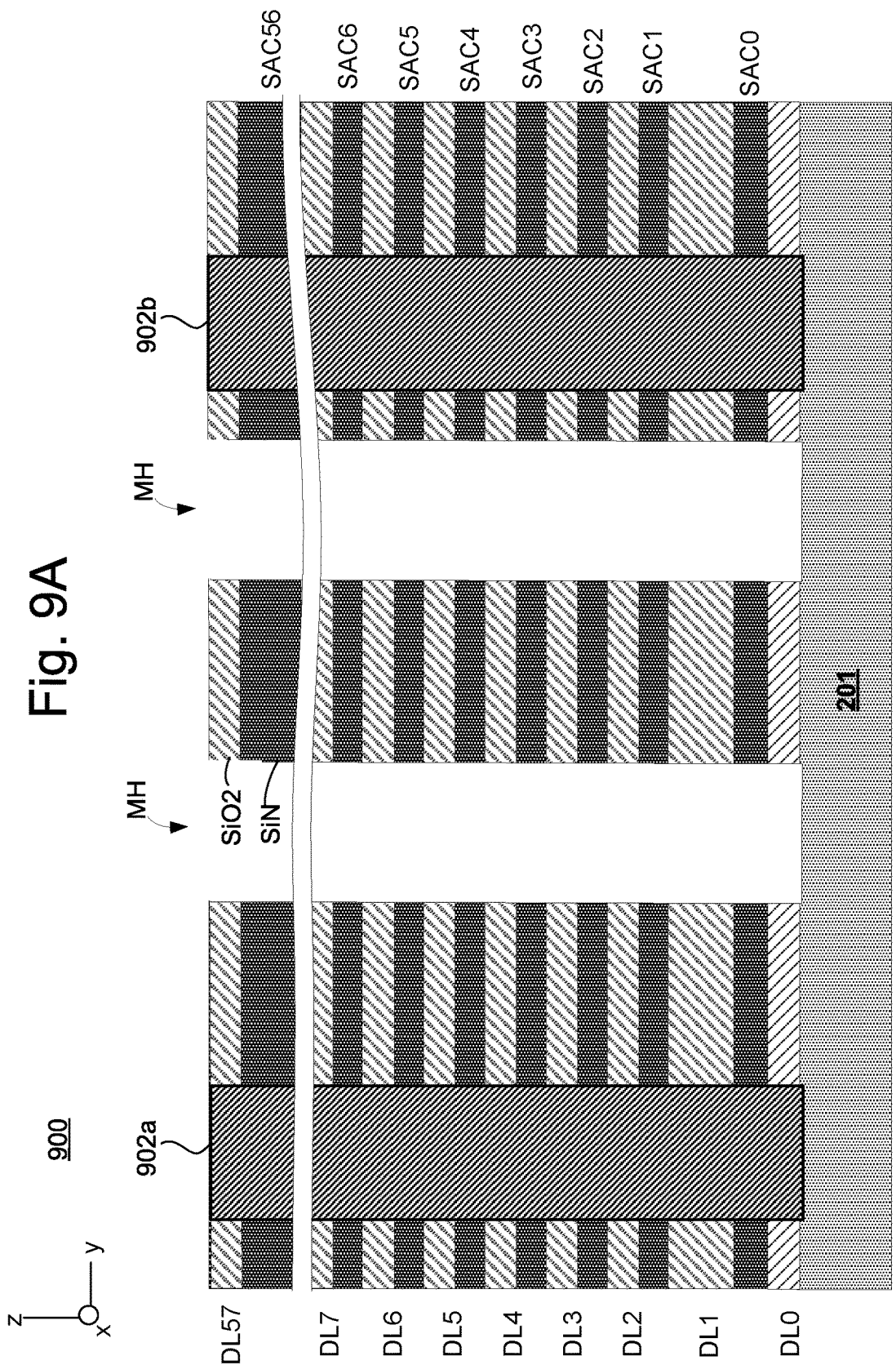

FIG. 9A shows results after one embodiment of step 808. FIG. 9A shows sacrificial layers (SAC0-SAC6 and SAC 56) alternating with insulating layers (DL0-DL7 and DL57) in a stack 900 over a semiconductor substrate 201. There may be more or fewer layers than in this example. Sacrificial layers SAC7 through SAC55 are not depicted in FIG. 9A. Insulating layers DL8 through DL56 are not depicted in FIG. 9A. FIG. 9A is consistent with formation of the device of FIG. 4D, which shows two memory holes 432, 434, and two source lines 344b, 344c. The two vertical memory holes (MH) in FIG. 9A correspond to memory holes 432, 434. In FIG. 9A, regions 902a, 902b are where insulation has been used to fill the slits. The source lines 344b, 344c will eventually be formed in regions 902a, 902b.

The sacrificial layers are silicon nitride (SiN) in this embodiment and will eventually be layers SGS, DWLL2a, DWWL2b, WLL0-WLL47, DWLL1b, DWWL2a, SGD3, SGD2, SGD1, and SGD0 (note that the aluminum oxide layer 477 may also be formed in the region vacated by the sacrificial layers in one embodiment). The insulating layers are silicon oxide in this embodiment. The two memory holes (MH) are depicted as extending vertically through the alternating sacrificial layers and insulating layers. The memory holes extend down to the semiconductor substrate 201, which is formed from silicon in one embodiment. Etching the memory holes could etch partway into the semiconductor substrate 201. An x-y-z coordinate system is depicted, showing the direction of formation. The memory holes each have a major axis that is parallel to the z-axis.

Figure 9B:
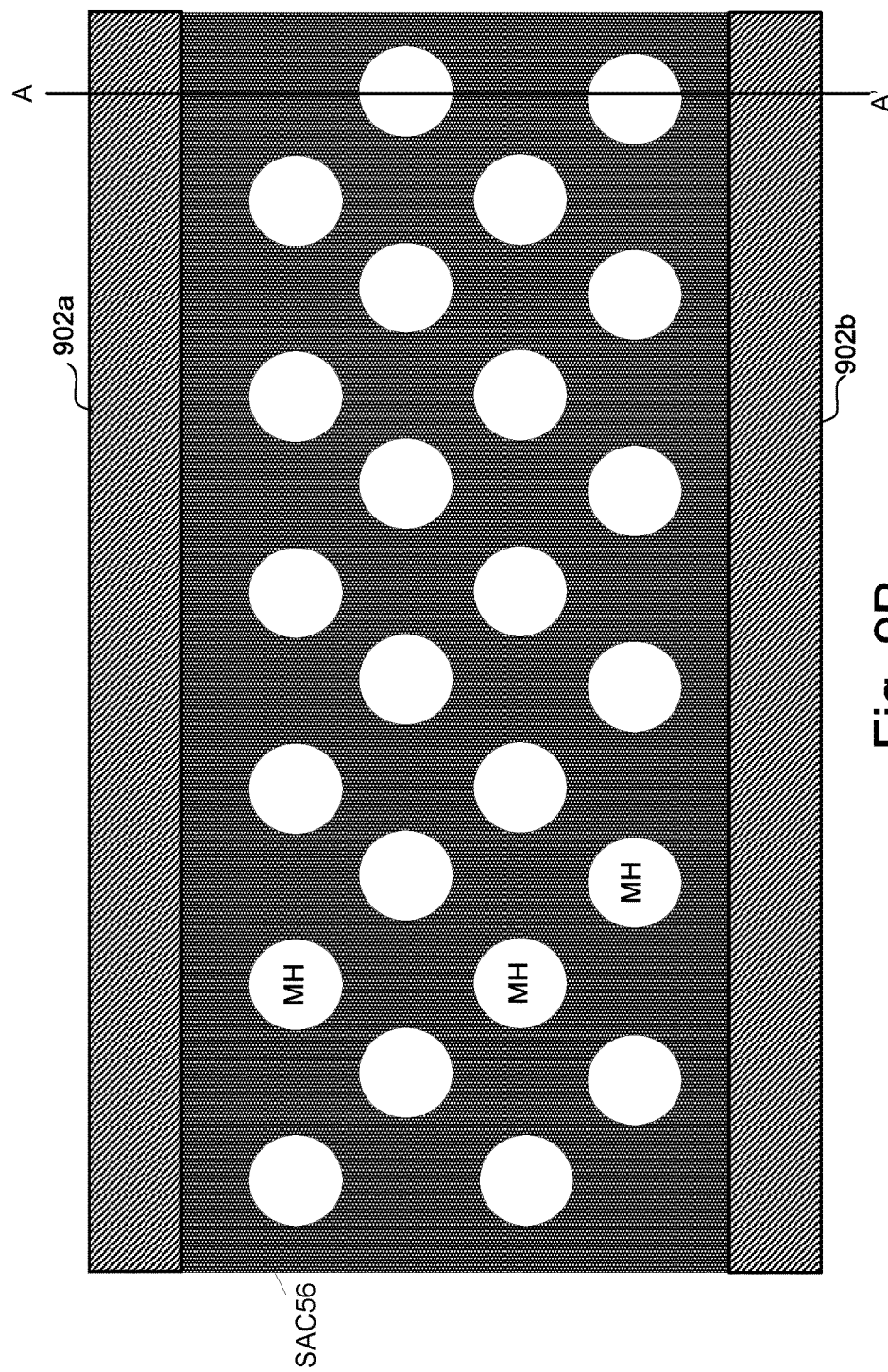

FIG. 9B shows a cross sectional view of sacrificial layer SAC56 from FIG. 9A after step 808, showing one possible pattern for the memory holes (MH). This is not the only possible pattern. For example, the memory holes do not need to be staggered as depicted. An x-y-z coordinate system is depicted, showing the direction of formation. Note that line A-A' indicates that FIG. 9A is a cross section along line A-A' of FIG. 9B. Also note that the memory holes have a circular cross section in the horizontal direction (e.g., x-y plane), in this example. The memory holes are not required to be circular in horizontal cross section. Note that the memory holes could be of different diameter in the different layers. For example, the memory holes could have a smaller diameter at the lower layers. FIG. 9B shows that the insulation filled slits 902a, 902b extend in the x-direction.

Step 604a is a SiN wet etch. Step 604a is one embodiment of step 604 of process 600. In one embodiment a phosphoric acid etch is performed. FIG. 9C depicts results after one embodiment of step 604a. A number of cavities 702 are depicted in the silicon nitride of the vertical sidewalls of the memory holes. In each memory hole, there is a cavity 702 in each layer of the silicon nitride, in this example. A number of bird's beak's 704 are depicted in the silicon nitride at the vertical sidewalls of the memory holes. The bird's beak's 704 are at the interface between the silicon oxide and silicon nitride. Each of the bird beaks 704 becomes thinner in the z-direction closer to the vertical sidewall of the memory hole. The bird beaks 704 may each have a tip at the surface of the vertical sidewall. A close up view of one of the bird's beak 704, cavity 702, portion of one layer of silicon nitride, and portions of two adjacent layers of silicon oxide is depicted.

Figure 9D:
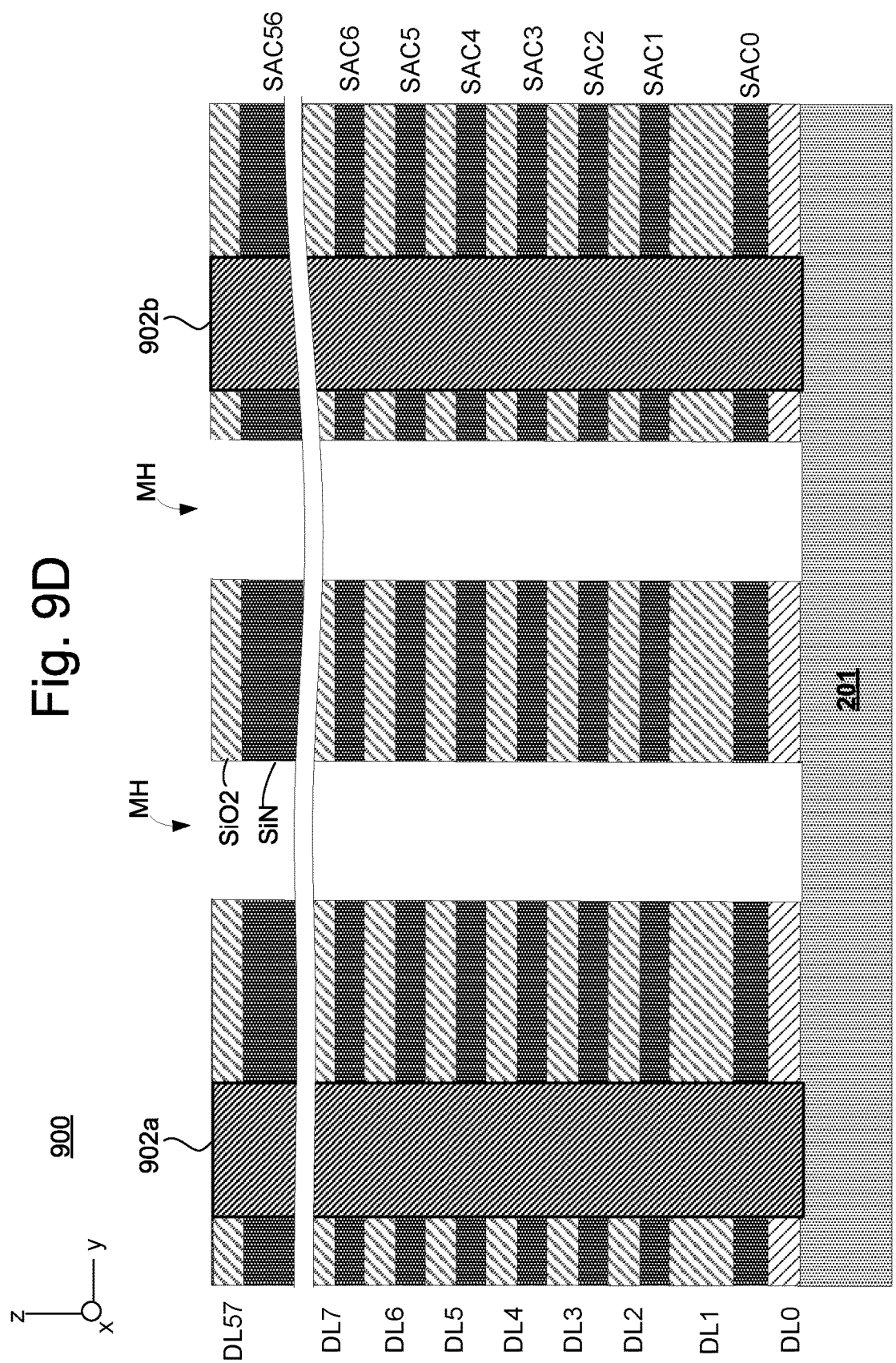

Step 606 is a DHF clean (also referred to as "pre-clean"). This is one embodiment of step 606 of process 600, hence the same reference numeral is used. FIG. 9D depicts results after one embodiment of step 606. FIG. 9D shows that the opening (MH) has a contour in which the vertical sidewall is nearly flat. For example, there is very little rounding (or very little curvature) in the z-direction in the SiN portions of the vertical sidewalls, and there is little rounding (or very little curvature) in the z-direction in the $SiO_2$ portions of the vertical sidewalls.

Step 810 includes formation of silicon at the bottom of the memory holes for the source side select transistor bodies. In one embodiment, the silicon is single crystal silicon. Step 810 includes epitaxial silicon growth at the bottom of the memory holes, in one embodiment. Step 810 is one embodiment of step 806 from process 800.

Figure 9E:
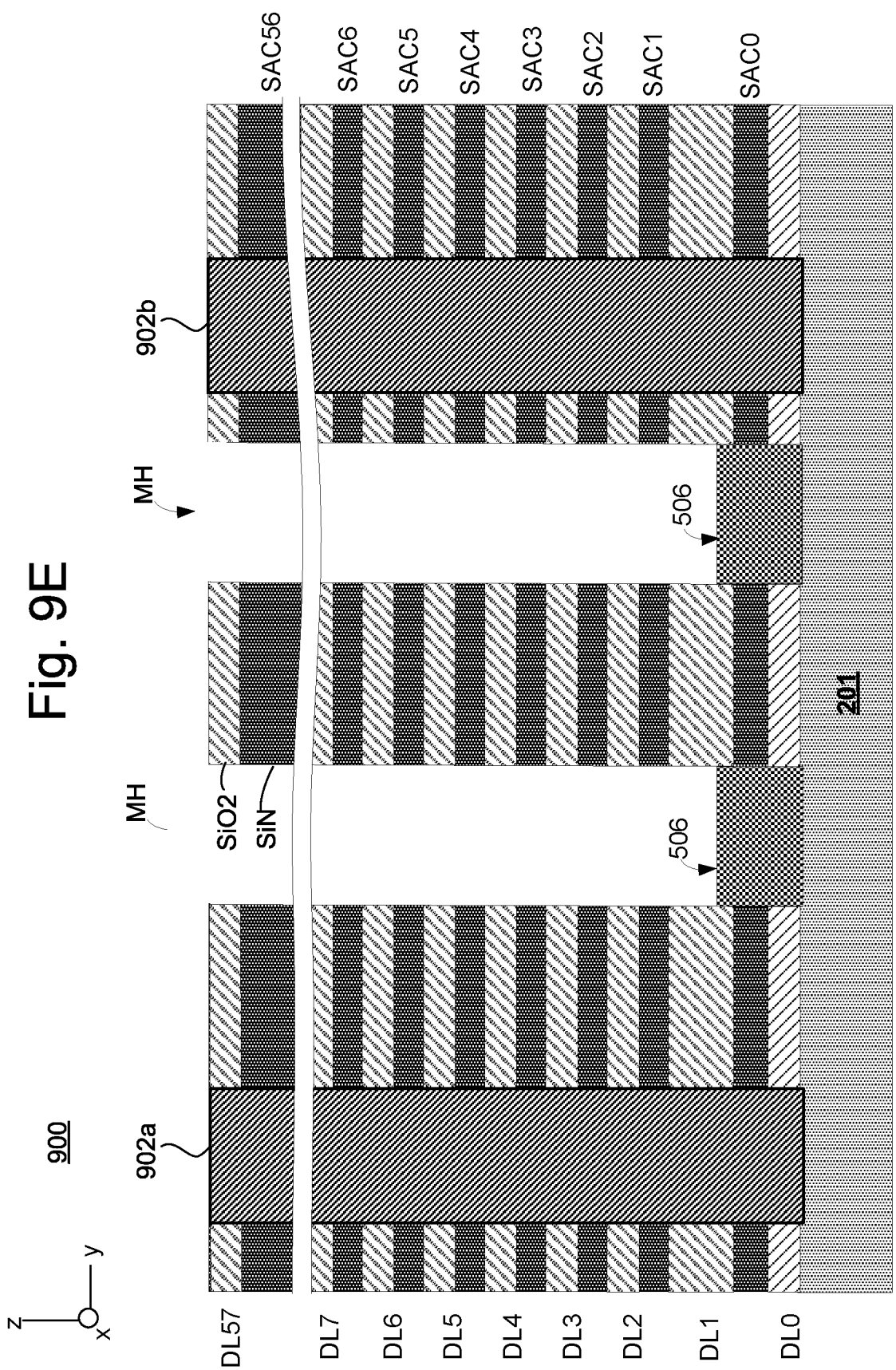

FIG. 9E depicts results after step 810, showing silicon region 506 in the bottom of the memory holes (MH). Note that silicon region 506 will serve as the body 506 of the source side select transistor. The silicon region 506 may cover the vertical sidewalls of the memory holes near the bottom (e.g., at DL0, sacrificial layer SAC0, and part of DL1). The silicon region 506 is in direct contact with the substrate 201, in the embodiment. In another embodiment, the silicon region 506 is in direct contact with a source line (SL) that is over the substrate 201 (there may be an insulator between the source line and substrate). FIG. 4C depicts one example having a source line (SL) over a substrate 201 (with insulator 454). Note that step 810 could form a semiconductor other than silicon for the bodies.

Step 812 is depositing a dielectric in the memory holes for at least a portion of the blocking layer. This may be deposited as a conformal layer over vertical sidewalls of the memory holes, as well as over the silicon region 506. In one embodiment, step 812 includes depositing a conformal layer of $SiO_2$ over vertical sidewalls of the memory holes. The $SiO_2$ may also cover the top of the silicon region 506.

Note that in some embodiments a portion of the blocking layer is formed outside of the memory holes. For example, referring back to FIG. 4E, an aluminum oxide layer 477 can be formed outside the memory holes. However, another option is to form aluminum oxide layer 477 within the memory holes, as in the example of FIG. 5A.

Step 814 is depositing the charge trapping layer (CTL) 473 in the memory holes. In one embodiment, a nitride such as SiN be deposited as a charge trapping layer 473. This may be deposited as a conformal layer over the blocking layer. The charge trapping layer 473 can be formed, for example, by chemical vapor deposition (CVD), atomic layer deposition (ALD), physical vapor deposition (PVD), or any suitable deposition technique.

Step 816 is depositing at least one of the layers of the tunnel dielectric 472 in the memory holes. The tunnel dielectric 472 may be deposited as a conformal layer on the charge trapping layer 473. Thus, the tunnel dielectric 472 may cover vertical sidewalls of the charge trapping layer 473, as well as the portion of the charge trapping layer 473 that is on the silicon region 506. The tunnel dielectric 472 can be formed, for example, by chemical vapor deposition (CVD), atomic layer deposition (ALD), physical vapor deposition (PVD), or any suitable deposition technique.

Step 816 may include depositing multiple layers, such as $SiO_2$ and SiON, with the $SiO_2$ nearest the charge trapping region (e.g., SiN). The tunnel dielectric might also include $SiO_2$ and ISSG (in-situ steam generation) formed oxide, with the $SiO_2$ nearest the charge trapping region. The tunnel dielectric might also include three layers: $SiO_2$, SiON, and ISSG formed oxide.

Step 818 is to deposit a protective layer over the tunnel dielectric layers. In one embodiment, a layer of silicon oxide is deposited. This may be deposited using CVD or ALD, as two examples. The silicon oxide may be about 5 nm in thickness. However, it could be thicker or thinner. The protective layer may serve to protect the tunnel dielectric during later etching steps.

Step 820 includes etching at the bottom of the memory holes to expose the silicon regions 506. In one embodiment, this is a reactive ion etch (RIE). Step 820 may include one or more anisotropic etch processes to sequentially etched various layers. The etch may include zero or more isotropic etch processes and zero or more anisotropic etch processes.

Step 822 is a post wet etch clean. This step removes of the protective layer (from step 818). In one embodiment, a wet etch is used to remove the silicon oxide protective layer. Also polymer residues from the etch of step 820 are etched away.

FIG. 9F shows results after step 822. The etching has created a gap in the memory file at the bottom of the memory holes to expose the top of silicon region 506. The etching has gone through the horizontal portion of tunnel dielectric layer(s) 472, through horizontal portion of the charge trapping layer 473, and through horizontal portion of the silicon oxide 478 at the bottom of the memory holes.

Step 824 is to form a semiconductor layer in the memory holes for the semiconductor channel of the memory cells. The semiconductor layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor layer includes amorphous silicon or polysilicon. The semiconductor layer can be formed by a conformal deposition method such as low pressure chemical vapor deposition (LPCVD). The thickness of the semiconductor layer can be in a range from 2 nm to 101 nm, although lesser and greater thicknesses can also be employed. The semiconductor layer may partially fill the cavity in each memory opening, or may fully fill the cavity in each memory opening.

Step 826 is an optional step of forming a dielectric core inside of the semiconductor channel. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

Certain of the steps of process 800 form a memory cell film in the memory holes. For example, steps 812, 814, 816, and 824 are one embodiment of forming a memory cell film in memory holes. Forming a memory cell film is not limited to steps 812, 814, 816, and 824.

Figure 9G:
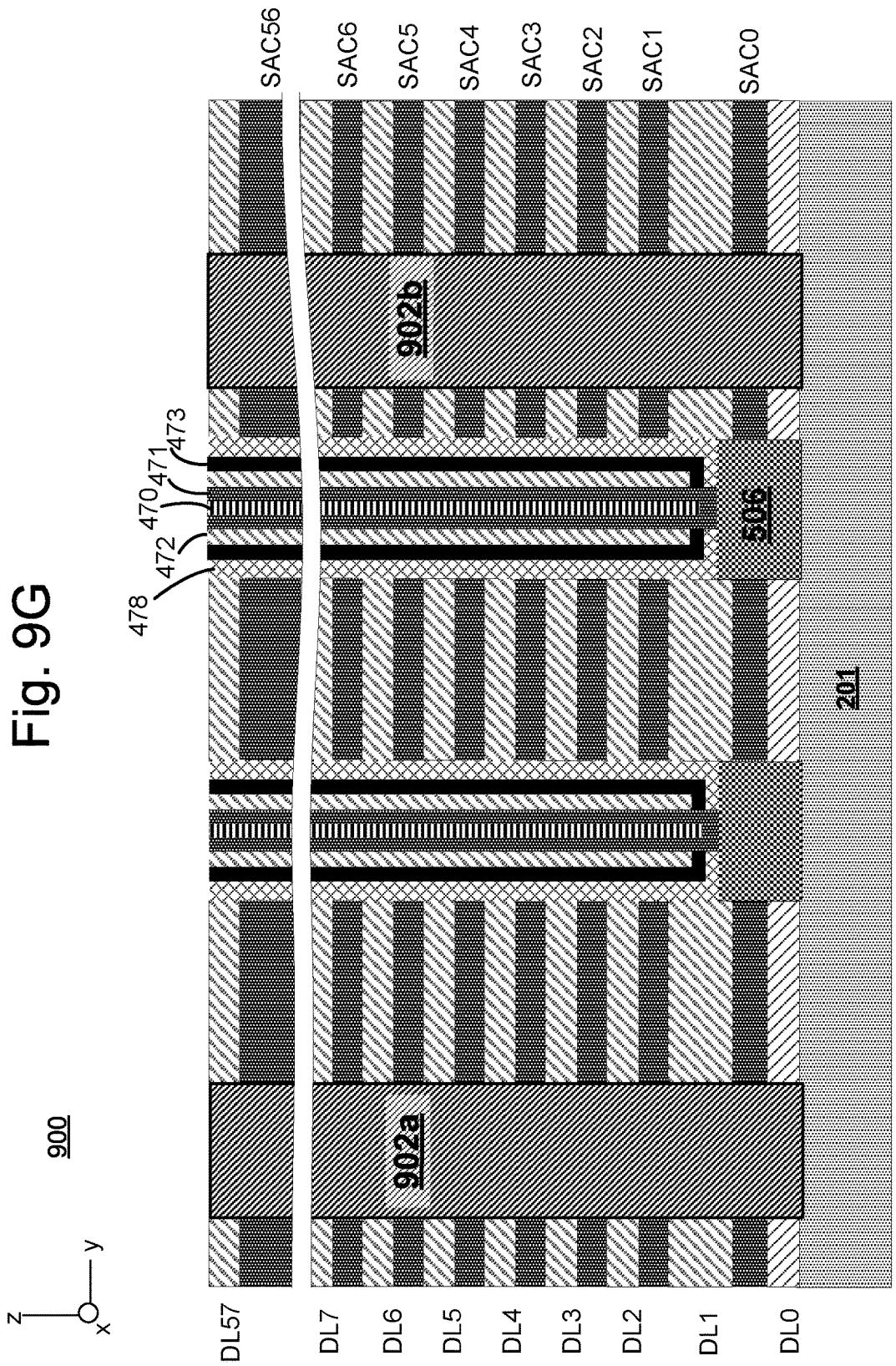

Step 828 is to remove a portion of the memory cell film outside of the memory holes. The horizontal portion of various layers can be removed, for example, by a recess etch or a chemical mechanical planarization (CMP). Optionally, an n-type dopant can be implanted in the drain end of the semiconductor channel. This creates an n+ region at the drain end that reduces contact resistance with a bit line contact, in one embodiment. FIG. 9G depicts results after step 828. FIG. 9G shows the addition of the semiconductor channel 471 and optional core dielectric 470 in the memory holes.

Step 830 is to etch the slits 902. This removes the material that was in the slits and is done to allow removal of the sacrificial silicon nitride and to deposit metal.

Step 832 includes performing an etch via the slits to remove portions of the silicon nitride layers. The etch can involve introducing an etchant via the slits, which has a higher selectivity for the silicon nitride, removing the silicon nitride layers. The wet etch is not relatively highly selective of the silicon oxide so that the silicon oxide is not substantially removed. The etch may have a relatively higher selectivity (e.g., by a factor of 1000, or more generally, 100 or more) for the silicon nitride relative than for the silicon oxide. Also note that the etch should not remove the NAND strings.

The wet etch should remove essentially the entire silicon nitride layers wherein the NAND strings are being formed (memory cell area), so that when the regions of the removed silicon nitride are replaced in at least part by metal, the metal will extend in substantially the entire layer in the memory cell area. Thus, word line layers at different levels should be isolated from one another and not shorted together. This applies regardless of the etch method, e.g., whether the etchant is introduced via the slits, memory holes, other holes or voids, or combinations thereof. The NAND strings in the memory holes serve as anchors which support the silicon oxide layers when the silicon nitride is removed by etching through slits.

A variety of etching techniques may be used to etch the silicon nitride. Nitride can be etched in one embodiment, by heated or hot phosphoric acid ($H_3PO_4$). As an example, the boiling point of phosphoric acid varies with the concentration of the acid. For example, for a range of acid concentration between 79.5%-94.5% the boiling point may vary from 140° C.-200° C. The etch rate of silicon nitride varies with the temperature and the concentration of the acid. Since the bath is operated at high temperature, water readily evaporates from the solution and the concentration of phosphoric acid changes. Therefore, this may be considered to be a type of "wet" etch. However, a wet etch is not necessarily needed for nitride, as other etching techniques may be applied. In other embodiments, the sacrificial material in the stack may be something other than silicon nitride. Therefore a different type of etch process and etchant may be used.

Figure 9H:
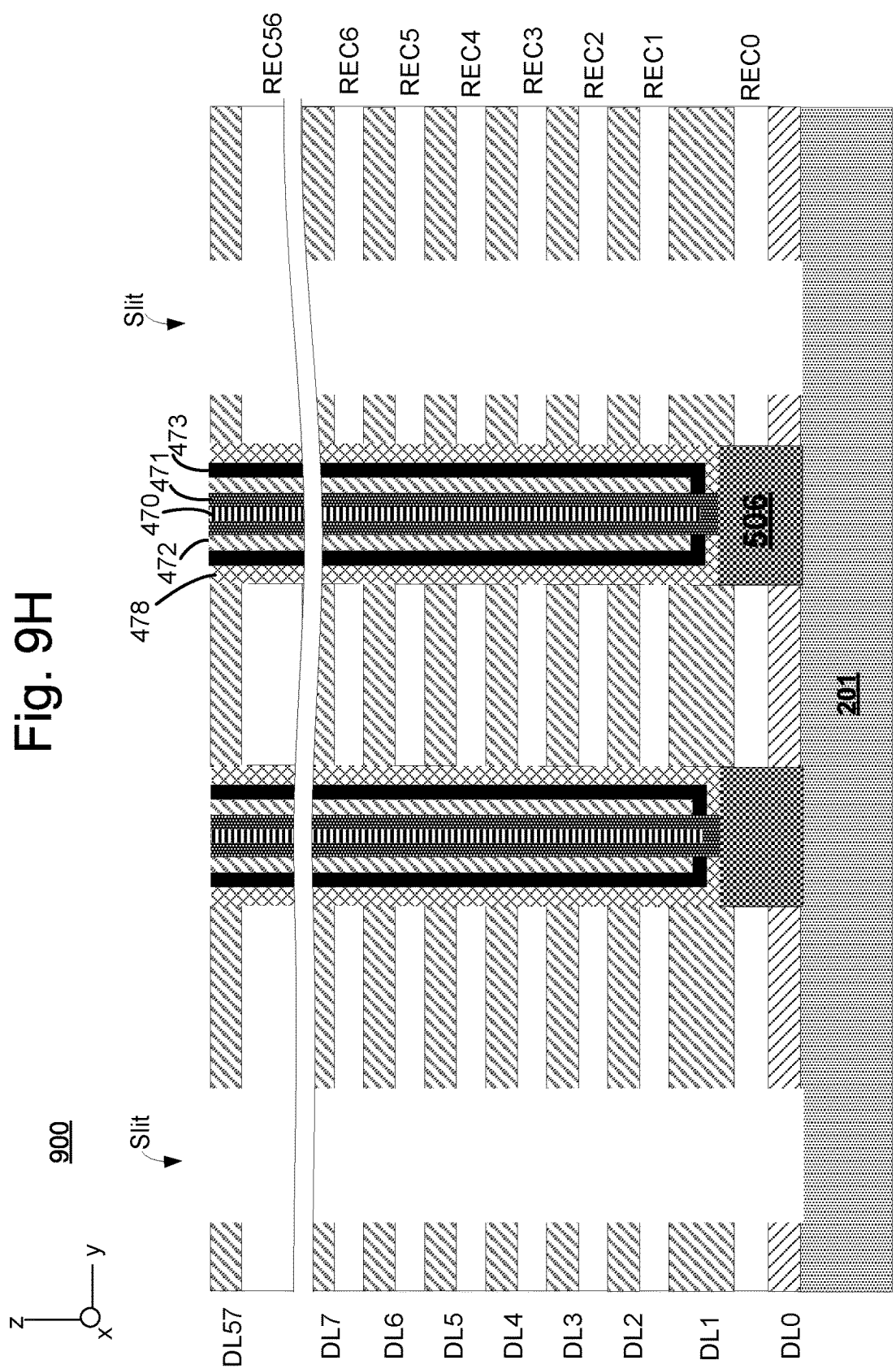

FIG. 9H depicts results after one embodiment of step 832. Recesses (REC0-REC6, REC56) are shown where sacrificial layers SAC0-SAC6 and SAC56 were.

Step 838 is an optional step of forming a gate oxide for the source side select transistors. Step 838 may include oxidation of sidewalls of the semiconductor region 506 to form gate oxides.

In optional step 840, a portion of the blocking layer is formed in the recesses. This portion of the blocking layer is an $Al_2O_3$ layer, in one embodiment. This portion of blocking layer may be deposited by ALD from outside of the memory hole through the slits.

Step 842 includes depositing metal (e.g., one or more layers) in the recesses via the slits. In one embodiment, the metal is tungsten. This forms a metal/oxide stack. Metal is provided in the slits to fill the recesses left when the sacrificial material was removed. Chemical vapor deposition (CVD) or atomic layer deposition (ALD) could be used to deposit the metal.

Step 844 is forming material in the slits for the local source lines (also referred to as local interconnects). Step 844 may include depositing an insulating layer in the slits to cover vertical sidewalls of the slits. Initially, the insulating layer may also cover the substrate at the bottom of the slits. The insulating layer in a slit may be etched to create an opening for the source line. The substrate 201 is exposed as a result of etching the insulating layer, in one embodiment. Step 844 may include depositing one or more conductive fill materials in the slits. The conductive fill materials serve as the source lines. For example, a first conductive fill material can include a doped semiconductor material such as doped polysilicon. The first conductive fill material might be used in the lower portion of the slits. A second conductive fill material can include at least one metallic material such as a combination of a conductive metallic nitride material (such as TiN) and a metal (such as W, Co, or Ru). Step 844 may also include one or more etching steps to remove excess fill material (for both the first and second fill material).

Figure 9I:
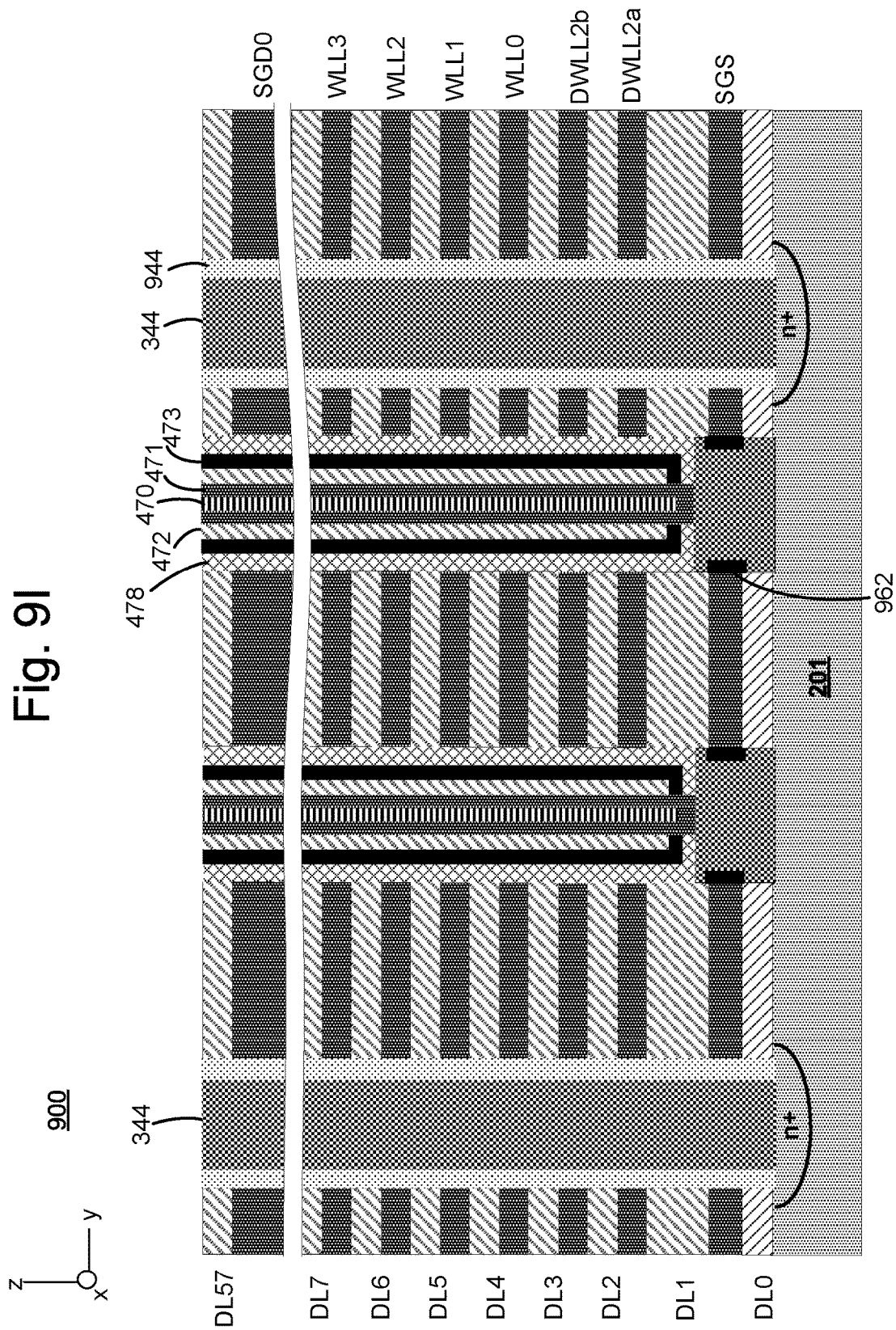

FIG. 9I depicts results after one embodiment of step 844. The gate oxide regions 962 are depicted on sidewalls of the semiconductor region 506. The recesses in the stack have been filled with a conductive material. Thus, the recess layers are re-labeled as SGS, DWLL2a, DWLL2b, WLL0, WLL1, WLL2, WLL3, and SGD0. As the aluminum oxide layer was described as being optional, it is not depicted in FIG. 9I. However, in one embodiment, there is an aluminum oxide layer 477 outside of the memory holes, as in FIG. 4C.

The source lines 344 are now formed in the slits. An insulating layer 1044 provides electrical insulation between the source lines 344 and the conductive layers (SGS, DWLL2a, DWLL2b, WLL0, WLL1, WLL2, WLL3, and SGD0).

After step 844, additional steps may be performed to form bit line contacts, source line contacts, bit lines, global source lines, etc.

Figure 10:
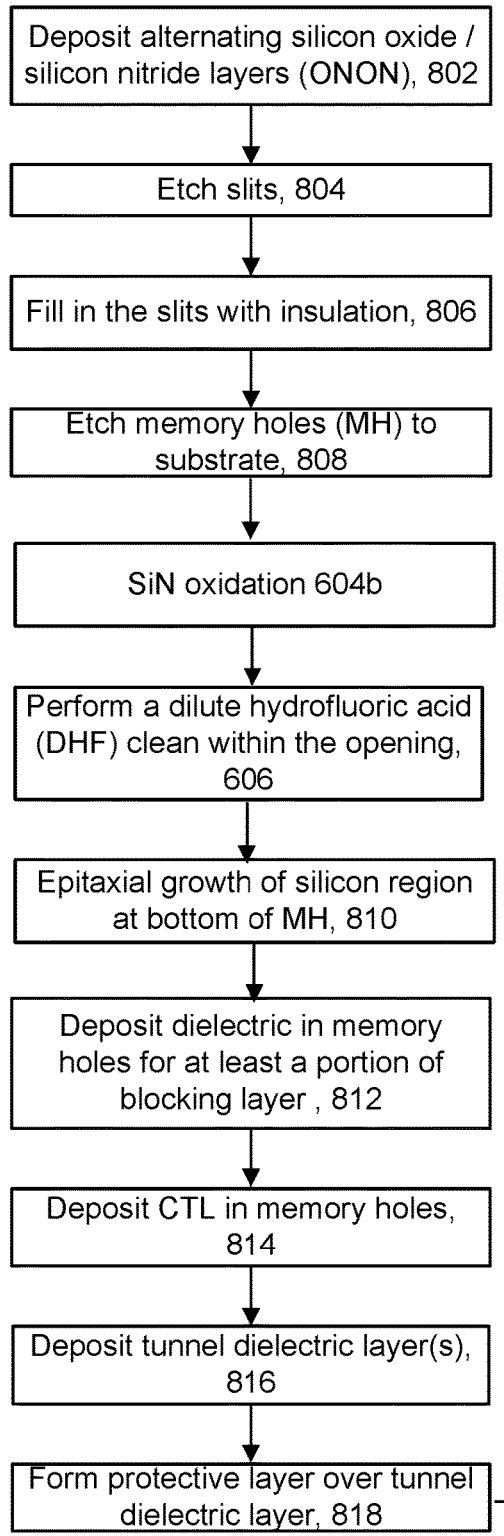
FIG. 10 is a flowchart of one embodiment of a process 1000 of forming memory cell film in memory holes in a stack of alternating layers of silicon oxide and silicon nitride.
Figure 10:
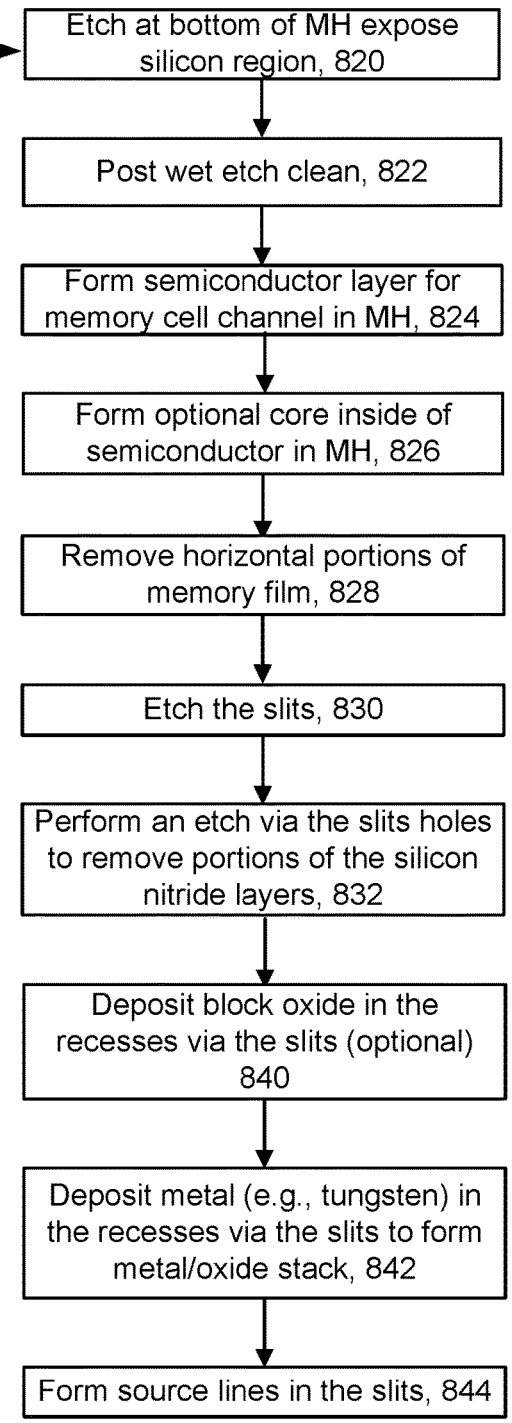

FIG. 10 is a flowchart of one embodiment of a process 1000 of forming memory cell film in memory holes in a stack of alternating layers of silicon oxide and silicon nitride. The process 1000 provides further details of one embodiment of the process 600 of FIG. 6. The process 1000 is similar to process 800 of FIG. 8. Thus, similar steps are referred to with the reference numeral used for the corresponding step in process 800. Similar steps will not be described in detail. Process 1000 begins with steps 802-808.

Figure 11:
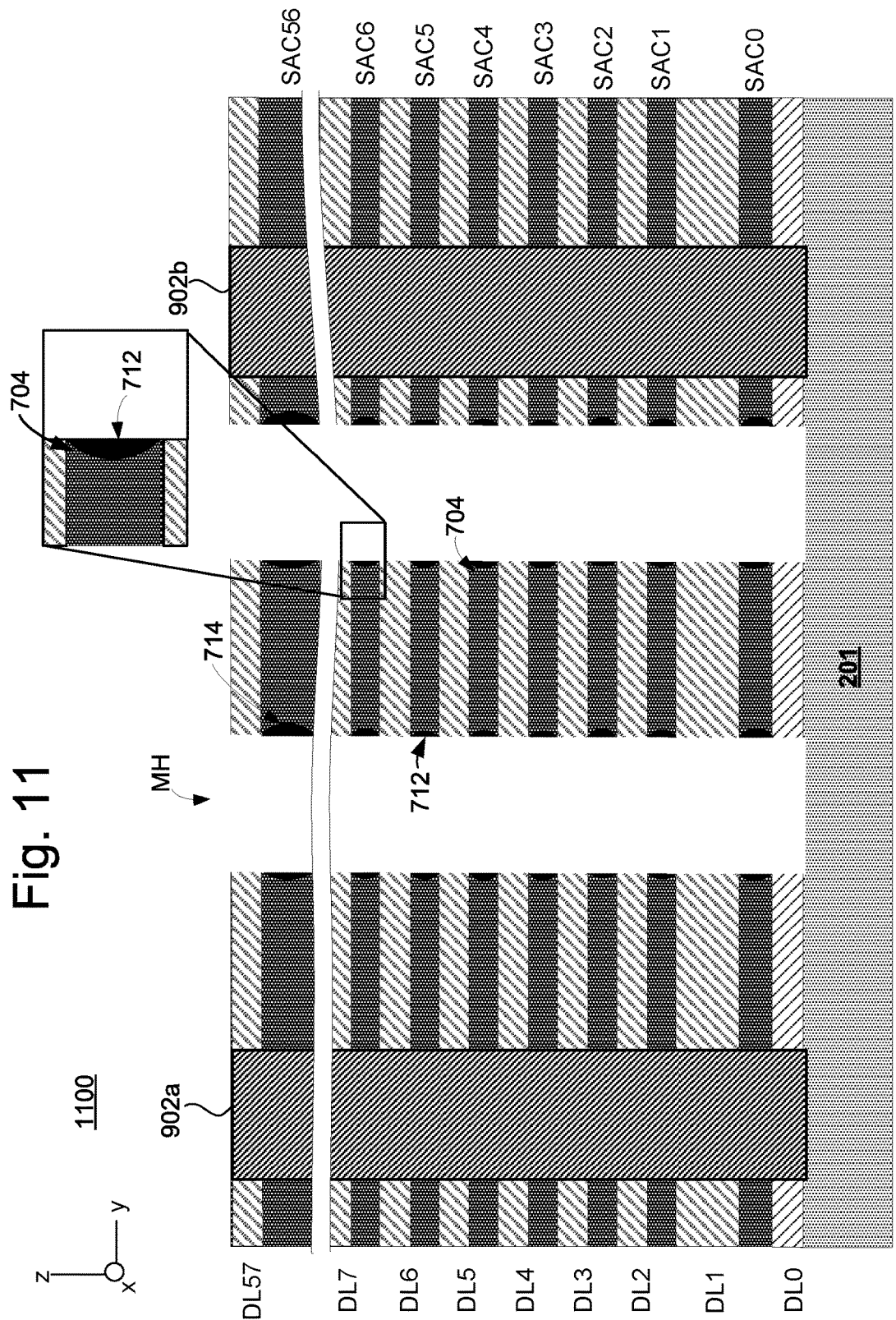
FIG. 11 depicts results after one embodiment of step 604b of process 1000 of FIG. 10.

After step 808, the silicon nitride is oxidized in step 604b. Step 604b is one embodiment of step 604 from process 600. FIG. 11 depicts results after one embodiment of step 604b. FIG. 11 depicts a stack 1100 of alternating layers of silicon oxide (e.g., DL0-DL7, DL57) and silicon nitride (e.g., SAC0-SAC6, SAC56) over substrate 201. Convex portions of the silicon nitride have been oxidized. In this embodiment, a convex portion of the SiN at the vertical sidewall of the memory hole (MH) has been oxidized. Oxidizing the portion of the SiN has created oxidized SiN 712 where there formerly was SiN. The portion of the silicon nitride that has not been oxidized has a concave surface 714. Each of the SiN regions has a bird's beak 704 at the interface between the SiN and the $SiO_2$. A close up view of one of the bird's beak 704, oxidized SiN 712, portion of one layer of silicon nitride, and portions of two adjacent layers of silicon oxide is depicted.

Step 606 is to perform a DHF clean within the memory holes. This is one embodiment of step 606 of process 600. Results may be similar to that depicted in FIG. 9D.

Remaining steps of process 1000 may be similar to process 800. Results may be similar to those depicted in FIGS. 9E-9I.

One embodiment disclosed herein includes a method of fabricating non-volatile storage. The method comprises forming an opening having a sidewall through a stack of alternating layers of silicon oxide and silicon nitride. Bird's beaks are formed in the silicon nitride at interfaces with the silicon oxide. The bird's beaks become thinner closer to the sidewall. A dilute hydrofluoric acid (DHF) clean is performed within the opening after forming the bird's beaks in the silicon nitride. A memory cell film is formed in the opening after performing the DHF clean.

One embodiment disclosed herein includes a method of fabricating non-volatile storage, comprising: forming a stack of alternating layers of silicon oxide and silicon nitride over a silicon substrate; forming memory holes in the alternating layers of silicon oxide and silicon nitride, each of the memory holes having a sidewall; performing an etch that selectively removes portions of the silicon nitride from the sidewalls of the memory holes; performing a dilute hydrofluoric acid (DHF) clean within the memory holes after removing the portions of the silicon nitride from the sidewalls of the memory holes; and forming a memory cell film in the memory holes after performing the DHF clean.

One embodiment disclosed herein includes a method of fabricating non-volatile storage, comprising: forming alternating layers of silicon oxide and silicon nitride over a silicon substrate; forming memory holes in the alternating layers of silicon oxide and silicon nitride, each of the memory holes having a sidewall; oxidizing portions of the silicon nitride at the sidewalls of the memory holes; performing a dilute hydrofluoric acid (DHF) clean within the memory holes after oxidizing the portions of the silicon nitride; and forming a memory cell film in the memory holes after performing the DHF clean.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A method of fabricating non-volatile storage, the method comprising:
   forming an opening through a stack of alternating layers of silicon oxide and silicon nitride, the opening having a sidewall;
   forming bird's beaks in the silicon nitride at interfaces with the silicon oxide, wherein the bird's beaks become thinner closer to the sidewall;
   performing a dilute hydrofluoric acid (DHF) clean within the opening after forming the bird's beaks in the silicon nitride; and
   forming a memory cell film in the opening after performing the DHF clean.

2. The method of claim 1, wherein the forming bird's beaks in the silicon nitride comprises:
   removing convex portions of the silicon nitride from the sidewall to form the bird's beaks from remaining portions of the silicon nitride.

3. The method of claim 2, wherein the removing convex portions of the silicon nitride from the sidewall comprises:
   performing a wet etch that selectively removes the convex portions of the silicon nitride and leaves a concave surface in the silicon nitride.

4. The method of claim 1, wherein the forming bird's beaks in the silicon nitride comprises:
   oxidizing the silicon nitride at the sidewalls to form the bird's beaks from portions of the silicon nitride that are not oxidized.

5. The method of claim 1, wherein the forming the opening through the stack of alternating layers of silicon oxide and silicon nitride comprises:
   forming the opening down to a semiconductor substrate;
   wherein performing the dilute hydrofluoric acid (DHF) clean removes residual oxide from the semiconductor substrate.

6. The method of claim 5, further comprising:
   growing silicon upwards from the semiconductor substrate after performing the DHF clean and prior to forming the memory cell film.

7. The method of claim 1, further comprising:
   removing the layers of the silicon nitride from the alternating layers of silicon oxide and silicon nitride leaving recesses in the stack; and
   forming control gates in the recesses for memory cells.

8. A method of fabricating non-volatile storage, the method comprising:
   forming a stack of alternating layers of silicon oxide and silicon nitride over a silicon substrate;
   forming memory holes in the alternating layers of silicon oxide and silicon nitride, each of the memory holes having a sidewall;
   performing an etch that selectively removes portions of the silicon nitride from the sidewalls of the memory holes;
   performing a dilute hydrofluoric acid (DHF) clean within the memory holes after removing the portions of the silicon nitride from the sidewalls of the memory holes; and
   forming a memory cell film in the memory holes after performing the DHF clean.

9. The method of claim 8, wherein the performing the etch that selectively removes the portions of the silicon nitride from the sidewalls of the memory holes comprises:
   selectively removing convex portions of the silicon nitride from the sidewalls of the memory holes, leaving concave surfaces in the silicon nitride.

10. The method of claim 8, wherein the performing the etch that selectively removes portions of the silicon nitride from the sidewalls of the memory holes comprises:
    forming bird's beaks in the silicon nitride at interfaces with the silicon oxide.

11. The method of claim 10, wherein an individual one of the bird's beaks has a tip at a surface of the memory hole associated with the bird's beak.

12. The method of claim 8, wherein the performing the etch that selectively removes the portions of the silicon nitride from the sidewalls of the memory holes comprises:
    performing a wet etch of the silicon nitride.

13. The method of claim 8, further comprising:
    removing the layers of the silicon nitride from the alternating layers of silicon oxide and silicon nitride leaving recesses in the stack; and
    forming control gates in the recesses for memory cells formed from the memory cell film.

14. The method of claim 8, further comprising:
    epitaxially growing silicon upwards in the memory holes from the silicon substrate after performing the DHF clean and prior to forming the memory cell film.

15. A method of fabricating non-volatile storage, the method comprising:
    forming alternating layers of silicon oxide and silicon nitride over a silicon substrate;
    forming memory holes in the alternating layers of silicon oxide and silicon nitride, each of the memory holes having a sidewall;
    oxidizing portions of the silicon nitride at the sidewalls of the memory holes;
    performing a dilute hydrofluoric acid (DHF) clean within the memory holes after oxidizing the portions of the silicon nitride; and
    forming a memory cell film in the memory holes after performing the DHF clean.

16. The method of claim 15, wherein the oxidizing portions of the silicon nitride at the sidewalls of the memory holes comprises:
    oxidizing convex portions of the silicon nitride at the sidewalls of the memory holes.

17. The method of claim 16, wherein the oxidizing the convex portions of the silicon nitride leaves un-oxidized concave portions of the silicon nitride that form bird's beaks at interfaces with the silicon oxide.

18. The method of claim 17, wherein an individual one of the bird's beaks has a tip at a surface of the memory hole associated with the bird's beak.

19. The method of claim 15, further comprising:
    epitaxially growing silicon in the memory holes from the silicon substrate after performing the DHF clean and prior to forming the memory cell film.

20. The method of claim 15, further comprising:
    removing the layers of the silicon nitride from the alternating layers of silicon oxide and silicon nitride leaving recesses; and
    forming control gates in the recesses for memory cells.

* * * * *